United States Patent
Liu et al.

(10) Patent No.: US 10,942,204 B1
(45) Date of Patent: Mar. 9, 2021

(54) TAYLOR WEIGHTED LEAST SQUARES METHOD FOR ESTIMATING SYNCHROPHASOR

(71) Applicant: NORTH CHINA ELECTRIC POWER UNIVERSITY, Beijing (CN)

(72) Inventors: Hao Liu, Beijing (CN); Tianshu Bi, Beijing (CN); Sudi Xu, Beijing (CN)

(73) Assignee: North China Electric Power University, Beijing (CN)

(*) Notice: Subject to any disclaimer, the term of this patent is extended or adjusted under 35 U.S.C. 154(b) by 0 days.

(21) Appl. No.: 17/081,697

(22) Filed: Oct. 27, 2020

(51) Int. Cl.
    *G01R 19/25*    (2006.01)
    *G01R 25/00*    (2006.01)

(52) U.S. Cl.
    CPC ....... *G01R 19/2513* (2013.01); *G01R 25/005* (2013.01)

(58) Field of Classification Search
    CPC .......................... G01R 19/2513; G01R 25/005
    USPC ........... 324/76.29, 76.44, 76.45, 76.68, 466; 702/60
    See application file for complete search history.

(56) References Cited

U.S. PATENT DOCUMENTS

| | | | |
|---|---|---|---|
| 2005/0027772 A1* | 2/2005 | Enenkel | G06F 7/5525 708/502 |
| 2015/0025880 A1* | 1/2015 | Le Roux | G10L 21/0208 704/233 |
| 2019/0227771 A1* | 7/2019 | Kitamura | G06F 7/5443 |

* cited by examiner

Primary Examiner — Giovanni Astacio-Oquendo
(74) Attorney, Agent, or Firm — Hunton AK, LLP

(57) ABSTRACT

An improved phasor estimation method for M-class phasor measurement units (PMUs) with a low computational burden is described. The method contains three steps: 1) A phasor measurement filter is designed by selecting parameters of Taylor weighted least square method to prioritize dynamic phasor accuracy and a high level of suppression on high-frequency interferences; 2) A finite impulse response lowpass filter is designed by the equal-ripple method is put forward to suppress low-frequency interferences; and 3) Phasor amplitude is corrected under off-nominal conditions.

1 Claim, 18 Drawing Sheets

(a) Filter coefficients  (b) Filter frequency response (a) Amplitude characteristic        (b) Phase characteristic

TAYLOR WEIGHTED LEAST SQUARES METHOD FOR ESTIMATING SYNCHROPHASOR

BACKGROUND

Accurate phasor estimation is critical to the reliable operation of power systems, particularly under interference and dynamic conditions. Taylor weighted least square (TWLS) method has been widely used due to its good dynamic performance. However, TWLS is sensitive to frequency deviation, and cannot consider anti-interference and dynamic performance capabilities simultaneously.

SUMMARY

To overcome these shortcomings, an accurate phasor estimation method for M-class phasor measurement units (PMUs) with a low computational burden is presented to improve TWLS in this disclosure. The method contains three steps: 1) A phasor measurement filter (PMF) is designed by selecting parameters of TWLS method to prioritize dynamic phasor accuracy and a high level of suppression on high-frequency interferences; 2) A finite impulse response (FIR) lowpass filter is designed by the equal-ripple method is put forward to suppress low-frequency interferences; and 3) Phasor amplitude is corrected under off-nominal conditions. In addition, a frequency and rate-of-change-of-frequency (ROCOF) estimation method based on the filtering analysis of least square (LS) method is proposed to improve their accuracy under dynamic conditions. Simulation and experimental test results show that the proposed method can require lower computational burden to provide higher accuracy measurements under off-nominal, dynamic and interference conditions, compared with some improved TWLS methods.

BRIEF DESCRIPTION OF THE DRAWINGS

In order to facilitate a fuller understanding of the present invention, reference is now made to the attached drawings. The drawings should not be construed as limiting the present invention, but are intended only to illustrate different aspects and embodiments of the invention.

DETAILED DESCRIPTION

Figure 1:
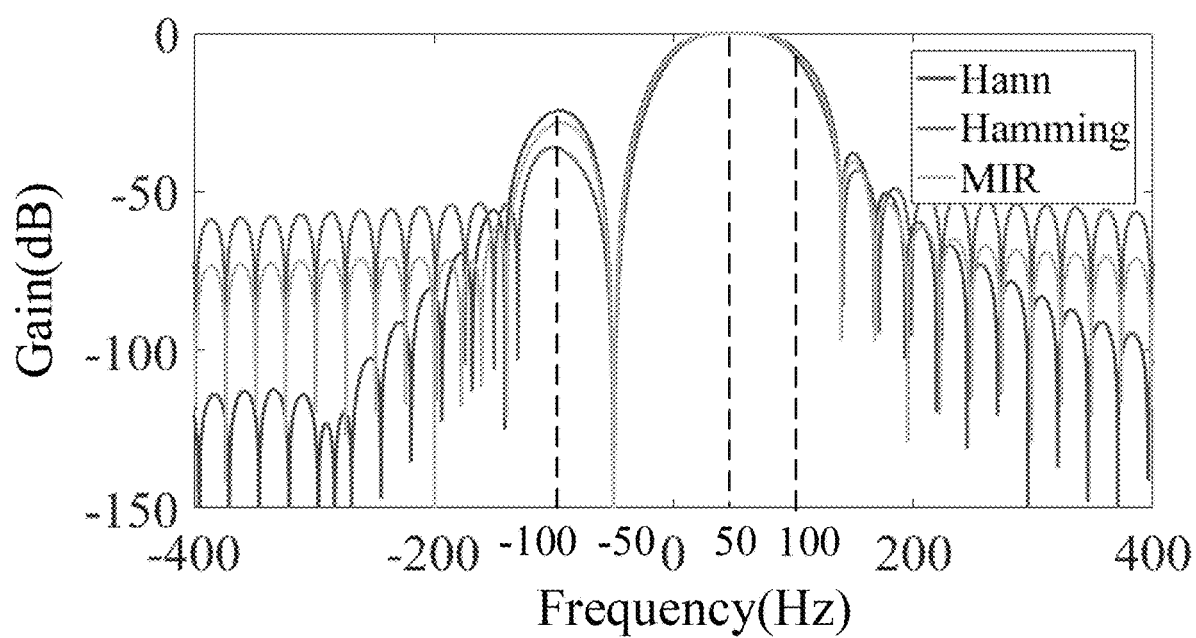
FIG. 1 shows exemplary magnitude response of PMF for different weighted coefficients.

Exemplary embodiments of the invention will now be described in order to illustrate various features of the invention. The embodiments described herein are not intended to be limiting as to the scope of the invention, but rather are intended to provide examples of the components, use, and operation of the invention.

I. INTRODUCTION

Phasor measurement units (PMUs) are widely deployed in power systems due to their synchronization and high reporting rate. The international standard IEEE/IEC 60255-118-1 (IEEE Std.) specifies measurement requirements under static and dynamic conditions. M-class PMUs must have superior anti-interference capabilities and dynamic estimation accuracy compared to P-class PMUs. Chinese PMU standards (CHN Std.) stipulate even higher requirements under interference and dynamic conditions. In addition, with the development of renewable energy and power electronic devices, an increasing number of harmonics and inter-harmonics occur in power systems. This requires PMUs with superior anti-interference performance. Furthermore, phasor measurement accuracy directly affects the validity of applications based on phasor data, such as state estimation and disturbance detection. Thus, a high-accuracy phasor estimation method is vital under interference and dynamic conditions, and must be compliant with IEEE and CHN Std.

A variety of phasor estimation methods have been considered. Most techniques can be classified as frequency-domain and time-domain algorithms, with the exception of some unique methods such as genetic algorithm and Gauss-Newton algorithm. The frequency-domain methods are based on discrete Fourier transform (DFT) and its improvements. To reduce the spectrum leakage problem, the special window and interpolated technique (IpDFT) were considered. However, DFT-based phasor estimation methods rely on a static phasor model, resulting in poor performance under dynamic conditions. Methods based on a dynamic phasor model may solve this problem, in which Taylor series expansion was used to approximate the time-varying amplitude and phase, and the least squares (LS) method, weighted least squares (WLS) method, Shanks' method, DFT combined with WLS method, and Kalman filter method may be applied to estimate Taylor series coefficients. Among them, WLS was a widely used method and called Taylor WLS (TWLS). Although TWLS has better dynamic measurement accuracy than other estimation methods, there are still some problems. Thus, many improved methods have been considered.

The measurement errors of TWLS become larger under off-nominal conditions. To solve this problem, the main idea was to estimate the fundamental frequency roughly, and then use TWLS to measure fundamental phasors, like TLS-ESPRIT, IpDFT, Phase-Locked-Loop (PLL), and iteration technique (frequency feedback). However, those methods need to recalculate the pseudoinverse matrix of TWLS, which will increase computational burden greatly. To overcome this shortcoming, two solutions were presented: 1) The TWLS coefficients corresponding to each frequency point were calculated offline. When the fundamental frequency was calculated by IpDFT or other methods, the TWLS coefficients corresponding to the frequency point closest to the estimated frequency were selected to estimate phasor. 2) A simplified expression of TWLS matrix was deduced, and then the estimated fundamental frequency was substituted into the expression rather than computing pseudoinverse matrix. Although the above methods solved the influence of frequency offset, additional algorithms besides TWLS were required to obtain the fundamental frequency. Thus, the computational complexity was increased, especially for TLS-ESPRIT and iteration technique.

In addition, TWLS method is also sensitive to harmonics and inter-harmonics. Therefore, some methods increased data window length to improve anti-interference abilities. But this would diminish the measurement accuracy under dynamic conditions. To consider both anti-interference and dynamic performance, three main methods may be considered: 1) The signal model contained harmonics and inter-harmonics, and their frequency locations were obtained by the compressive sensing (CS) algorithm. However, the iterative processes in CS algorithm may require large computational cost. 2) Static and dynamic signals were distinguished by establishing a detector. Then, long window length was used for steady-state signals to increase anti-interference ability, and short window length was used for dynamic signals to ensure dynamic performance. However, this method may rely on an accurate detector. If the detector is unreasonable, static and dynamic signals cannot be distinguished accurately. 3) The parameters of 2nd harmonic which has the most significant impact on phasor were calculated, and then the 2nd harmonic signal was reconstructed and removed from the signal. However, this method cannot eliminate multiple inter-harmonics near 2nd harmonic. Besides, if the reconstructed 2nd harmonic was incorrect, it was equivalent to introducing a new interference component.

TWLS can directly estimate frequency and ROCOF according to the coefficients of Taylor series. Compared with the difference method, LS method, and bandlimited derivators, TWLS reduces the calculation delay, but requires complex computational analysis. In addition, the increase of data window length in the above methods may lose the frequency and ROCOF accuracy under dynamic conditions (especially for phase modulation), and it has not been solved in recent literatures.

Consequently, TWLS is sensitive to frequency deviation, and cannot provide both anti-interference capability and dynamic performance simultaneously. Although, there are many related researches, they have high computation burdens, or have difficulties in solving the two problems at the same time. Furthermore, most of the improved methods mentioned above cannot meet the CHN Std. in some testing scenarios.

Therefore, this disclosure provides for a phasor measurement method for M-class PMU with a low computation burden to overcome all the above shortcomings of TWLS method. A three-step procedure based on TWLS method is described to estimate synchrophasor. Compared with other improved TWLS methods, the described procedure can obtain accurate phasor at off-nominal frequencies without addition algorithms to calculate the fundamental frequency. It also enhances its interference suppression ability while still can ensure its dynamic performance. Then, a frequency and ROCOF estimation method based on LS algorithm filtering characteristics is presented, which can provide more accurate frequency and ROCOF than other methods under oscillation conditions. The described method is verified by comprehensive simulation and experimental tests. Test results show that the method can require lower computational burden to obtain the measurements with accuracy at least 10 times higher than the standard requirements.

II. BACKGROUND THEORY

Two types of TWLS methods have been considered, one based on real value, and the other based on complex value. Both techniques display the same estimation accuracy for the same observation window and Taylor's series order, but real value WLS (RWLS) requires less computation than the complex value WLS. Therefore, RWLS is selected as the basis of the described method.

The fundamental signal of power systems can be modelled as $$x(t) = \sqrt{2}\, a(t) \cdot \cos(2\pi f_n t + \varphi(t)) \qquad (1)$$
$$= \sqrt{2}\, [a(t)\cos(\varphi(t))\cos(2\pi f_n t) - a(t)\sin(\varphi(t))\sin(2\pi f_n t)]$$

where $f_n$ is the nominal frequency, $a(t)$ is the dynamic amplitude, and $\varphi(t)$ is the dynamic phase. $a(t)\cos\varphi(t)$ and $a(t)\sin\varphi(t)$ can be approximated by Taylor's series, and thus (1) is rewritten as:

$$x(t) \approx \sqrt{2} \sum_{i=0}^{K} a_i t^i \cos(2\pi f_n t) - \sqrt{2} \sum_{i=0}^{K} b_i t^i \sin(2\pi f_n t) \qquad (2)$$

where $a_i$ and $b_i$ are Taylor's series coefficients, and K denotes Taylor's series order.

The Taylor's series coefficients can be obtained by WLS method as follows $$H = (P^T W^T W P)^{-1} P^T W^T w x \qquad (3)$$

$$T = \left[-\frac{N}{f_s}, \frac{N-1}{f_s}, L, 0, L, \frac{N-1}{f_s}, \frac{N}{f_s}\right]^T \qquad (4)$$
$$= [t_{-N}, t_{-(N-1)}, L, t_0, L, t_{N-1}, t_N]^T$$

$$P = \qquad (5)$$

$$\sqrt{2} \cdot \begin{bmatrix} t_{-N}^0 C(t_{-N}) & L & t_{-N}^K C(t_{-N}) & t_{-N}^0 S(t_{-N}) & L & t_{-N}^K S(t_{-N}) \\ t_{-(N-1)}^0 C(t_{-(N-1)}) & L & t_{-(N-1)}^n C(t_{-(N-1)}) & t_{-(N-1)}^0 S(t_{-(N-1)}) & L & t_{-(N-1)}^K S(t_{-(N-1)}) \\ M & L & M & M & L & M \\ t_0^0 C(t_0) & L & t_0^K C(t_0) & t_0^0 S(t_0) & L & t_0^K S(t_0) \\ M & L & M & M & L & M \\ t_{N-1}^0 C(t_{N-1}) & L & t_{N-1}^K C(t_{N-1}) & t_{N-1}^0 S(t_{N-1}) & L & t_{N-1}^K S(t_{N-1}) \\ t_N^0 C(t_N) & L & t_N^K C(t_N) & t_N^0 S(t_N) & L & t_N^K S(t_N) \end{bmatrix}$$

where $H = [a_0, a_1, \ldots, a_K, b_0, b_1, \ldots, b_K]^T$, composed of the Taylor's series coefficients to be solved; P can be obtained by (4) and (5), determined by K, sample frequency $f_s$, and the observation window length $T_L$; $x = [x(k), x(k+1), \ldots, x(k+2N)]^T$, representing 2N+1 continuous sampled values and $k=0, 1, 2 \ldots$ is the discrete time index; $C(t) = \cos(2\pi f_0 t)$, and $S(t) = -\sin(2\pi f_0 t)$; $W = \text{diag}[w(-N), w(-N+1), \ldots, w(0), \ldots, w(N-1), w(N)]$ is the diagonal matrix formed by the adopted window $w(\cdot)$ such as Hann window.

The time stamp is marked in the middle of the observation window, then the fundamental phasor in the current calculation window is:

$$\dot{X} = a(0)e^{j\varphi(0)} = a(0)\cos(\varphi(0)) + ja(0)\sin(\varphi(0)) = a_0 + jb_0 \qquad (6)$$

where $\dot{X}$ denotes the fundamental phasor.

In (3), let $$Q = (P^T W^T W P)^{-1} P^T W^T W = \begin{bmatrix} q_0^{a_0} & q_1^{a_0} & \cdots & q_{2N}^{a_0} \\ \vdots & \vdots & \vdots & \vdots \\ q_0^{a_K} & q_1^{a_K} & \cdots & q_{2N}^{a_K} \\ q_0^{b_0} & q_1^{b_0} & \cdots & q_{2N}^{b_0} \\ \vdots & \vdots & \vdots & \vdots \\ q_0^{b_K} & q_1^{b_K} & \cdots & q_{2N}^{b_K} \end{bmatrix} = \begin{bmatrix} q_{a_0} \\ \vdots \\ q_{a_K} \\ q_{b_0} \\ \vdots \\ q_{b_K} \end{bmatrix} \qquad (7)$$

When $f_s$, K, $T_L$ and $w(\cdot)$ are determined, P and Q can be calculated offline instead of real-time computation. According to (6) and (3), the phasor measurement can be rewritten as $$\dot{X}_c = a_0 + jb_0 = \sum_{i=0}^{2N} (q_i^{a_0} + jq_i^{b_0}) x(i) \qquad (8)$$

where $\dot{X}_c$ denotes the estimated fundamental phasor.

Let $$h'(i) = q_i^{a_0} + jq_i^{b_0}, h(i) = h'(2N-i) (0 \leq i \leq 2N) \qquad (9)$$

According to the definition of digital filter, (8) is equivalent to filtering the sampled data in the observation window with the complex filter h to obtain the fundamental phasor. In this disclosure, h is called a phasor measurement filter (PMF).

III. PHASOR ESTIMATION ALGORITHM

A. Exemplary Algorithm

The RWLS method has larger errors under off-nominal conditions. Besides, increasing data window can improve the ability of suppressing harmonics and inter-harmonics, but the dynamic measurement performance would become worse. To solve these two problems, a new solution combined with a FIR digital filter is presented in this disclosure:

- A PMF with short data window is designed to estimate initial phasors. In this step, PMF needs to ensure the accuracy of dynamic phasor estimation and have good suppression on high frequency interferences.
- A FIR lowpass filter is designed to filter the low-frequency interferences in the estimated initial phasors, including negative fundamental component, harmonics, and inter-harmonics.
- An amplitude correction is performed to compensate the passband attenuation on the positive fundamental component under off-nominal conditions.

This method eliminates the influence of frequency offset without additional algorithms to calculate fundamental frequency, and considers both the anti-interference ability and dynamic estimation performance even with a long data window.

More specifically, a phasor measurement method for M-class PMU with a low computation burden is described. In a first step, a phasor measurement filter with short data window is designed to estimate initial phasors. In particular, the Hann window is selected as the weighted coefficients. To ensure the dynamic accuracy and anti-interference ability, K=2 is optimal, where K denotes Taylor's series order. Additionally, the observation window length $T_L$ is set as three cycles (0.06 s) to maintain the dynamic performance and anti-interference capability, compared with other window lengths.

In a second step, a FIR lowpass filter is designed to filter the low-frequency interferences in the estimated initial phasors, including negative fundamental component, harmonics, and inter-harmonics. The filtering equation is given as:

$$\dot{X}'_{t_k} = \sum_{i=k}^{k+N_f} h_{lp}(i-k) \dot{X}_{t_k}(i - N_f/2) \qquad (10)$$

where $N_f$ is the filter order, $h_{lp}(i)$ is the filter coefficients, and $\dot{X}_{t_k}'$ is the filtered phasor. Passband and stopband bandwidths are determined by the reporting rate of PMU. The maximum passband bandwidth is $0 \sim \min(5, F_r/5)$ Hz and stopband bandwidth is $F_r/2 \sim F_c/2$ ($F_c$ is the computation rate).

In a third step, an amplitude correction is performed to compensate the passband attenuation on the positive fundamental component under off-nominal conditions. Because the amplitude is mainly determined by the PMF and lowpass gain at the fundamental frequency, it can be corrected as follows:

$$\hat{\dot{X}}_c = \frac{\dot{X}'_{t_k}}{|H(\hat{f}_0)| \cdot |H_{lp}(\hat{f}_0 - 50)|} \qquad (11)$$

where $\hat{f}_0$ is the estimated fundamental frequency (frequency estimation method is shown in Section IV), $|H(f)|$ and $|H_{lp}(f)|$ are the magnitude response of the designed PMF and lowpass filter, and $\hat{\dot{X}}_c$ is the final synchrophasor.

Figure 9:
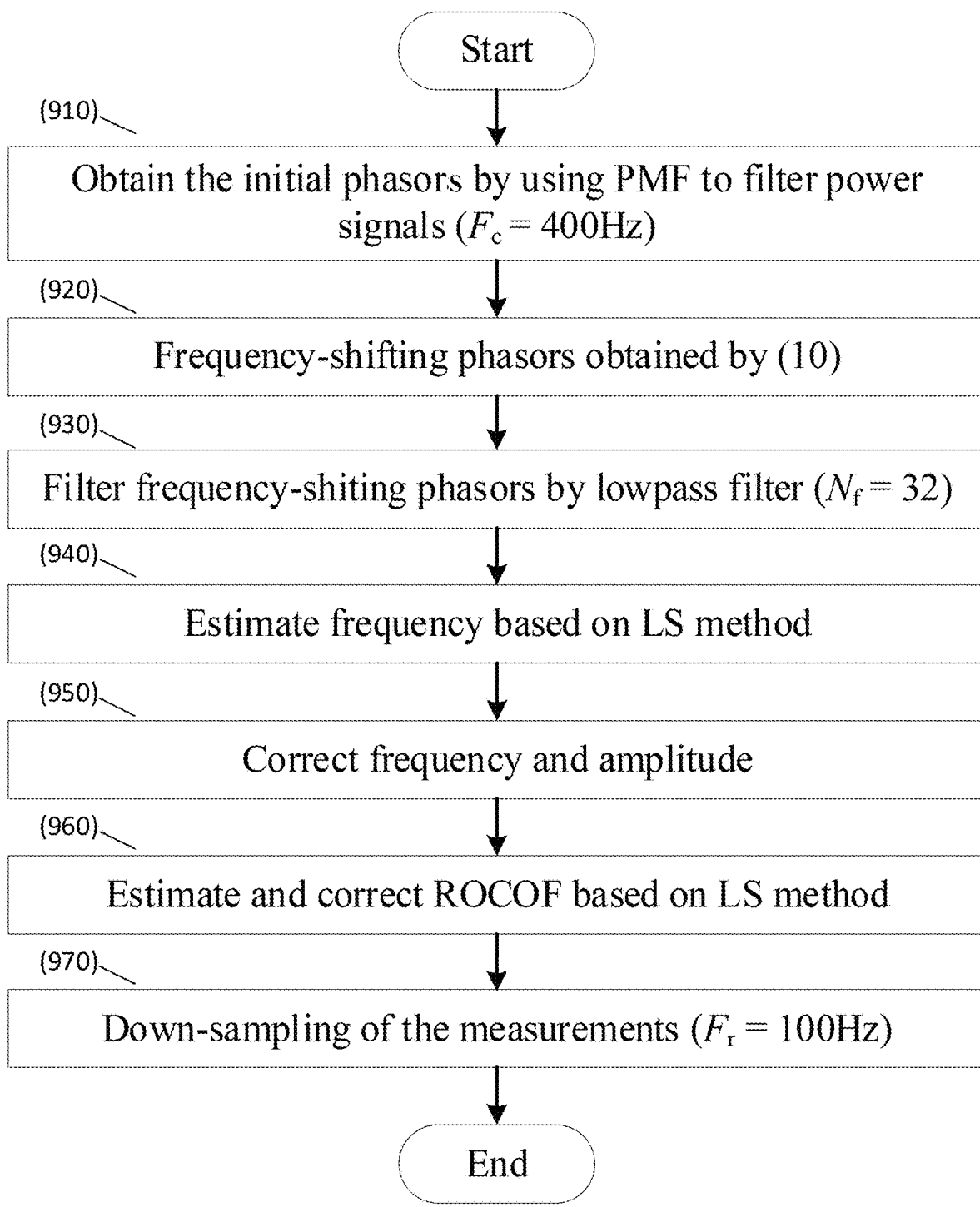
FIG. 9 shows exemplary implementation flowchart of the phasor estimation method.

FIG. 9 shows exemplary implementation flowchart of the phasor estimation method. After designing PMF, in step 910, the initial phasor can be obtained by:

$$\dot{X}_c = a_0 + jb_0 = \sum_{i=0}^{2N}(q_i^{a_0} + jq_i^{b_0})x(i) \quad (12)$$

where $\dot{X}_c$ denotes the estimated fundamental phasor.

Then, in step 920, the synchrophasor can be obtained by carrying out a frequency shift when it is reported to main stations at $t_k$:

$$\dot{X}_{t_k} = \dot{X}_c e^{-j2\pi f_n t_k} \quad (13)$$

where $\dot{X}_c$ denotes the synchrophasor to be reported.

In step 930, the designed lowpass filter can be used to suppress the interferences in the frequency-shifting phasor, as shown in Equation 12.

In step 940, the frequency is estimated based on LS method. Specifically, the initial frequency is measured by $$\hat{f}(k) = \frac{1}{2\pi}\sum_{i=0}^{M} q_{1i}\varphi(k - M/2 + i) + f_n \quad (14)$$

where $\varphi(k)$ is the phase angle of synchrophasor, and $\hat{f}(k)$ is the estimated frequency. This equation uses $q_1$ to filter (M+1) estimated phase angles to obtain the initial frequency.

In step 950, the frequency and amplitude are corrected. The frequency can be corrected by the following two sub-steps: First, the second derivative of frequency is measured by $$cf_2(k) = \sum_{i=0}^{M} q_{2i}\hat{f}(k - M/2 + i) \quad (15)$$

where $cf_2(k)$ is the second derivative of the frequency. This equation uses $q_2$ to filter (M+1) initial frequencies.

Second, according to the second derivative of frequency, the frequency error is corrected by $$\hat{f}_0(k) = \hat{f}(k) - 2.85 \times 10^{-5} cf_2(k) \quad (16)$$

and then the final frequency is obtained.

The amplitude can be corrected as follows:

$$\hat{\dot{X}}_c = \frac{\dot{X}'_{t_k}}{|H(\hat{f}_0)| \cdot |H_{1p}(\hat{f}_0 - 50)|} \quad (17)$$

where $\hat{f}_0$ is the estimated fundamental frequency (frequency estimation method is shown in Section IV), $|H(f)|$ and $|H_{lp}(f)|$ are the magnitude response of the designed PMF and lowpass filter, and $\hat{\dot{X}}_c$ is the final synchrophasor.

Next, in step 960, an ROCOF estimation method based on the filtering characteristics of LS method is implemented. First, the initial ROCOF is measured by $$r\hat{f}(k) = \sum_{i=0}^{M} q_{1i} f(k - M/2 + i) \quad (18)$$

that uses $q_1$ to filter (M+1) estimated frequencies.

Second, the second derivative of ROCOF is measured by $$c_2(k) = \sum_{i=0}^{M} q_{2i} r\hat{f}(k - M/2 + i) \quad (19)$$

that uses $q_2$ to filter (M+1) initial ROCOFs.

Third, according to the second derivative of ROCOF, the ROCOF error is corrected by $$r\hat{f}_c(k) = r\hat{f}(k) - 2.85 \times 10^{-5} c_2(k) \quad (20)$$

and then the final ROCOF is obtained.

In step 970, because the computation rate of synchrophasor is higher than its reporting rate, the synchrophasors needs to be downsampling to report them to the data center.

Figure 14:
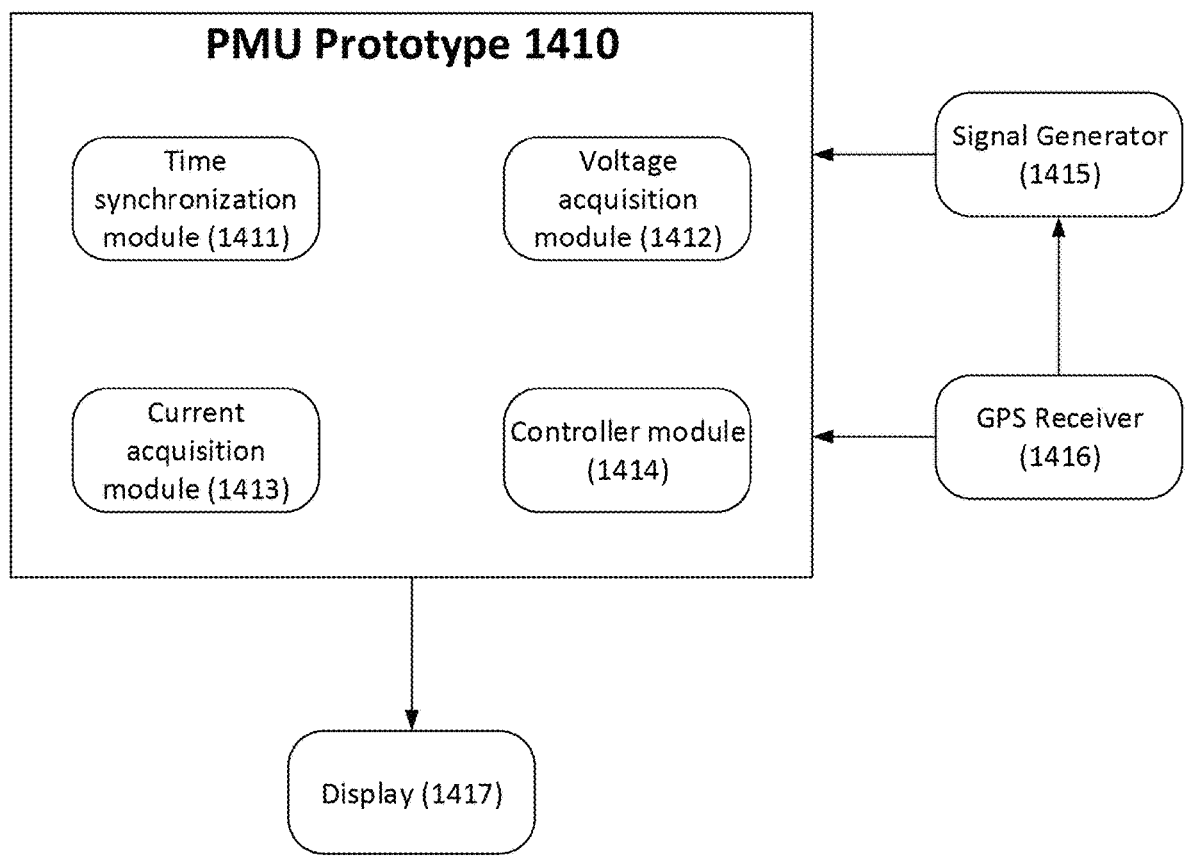
FIG. 14 shows exemplary equipment for evaluating the performance of a PMU prototype.

The presented estimation method has been implemented in a PMU prototype, as shown in FIG. 14. The experimental tests show that the estimation accuracy of the PMU prototype meets the IEEE and Chinese PMU standards, indicating that the presented method can be applied in practical applications.

B. Step 1: Design of PMF Coefficients

1) Selection of PMF Parameters

Figure 2:
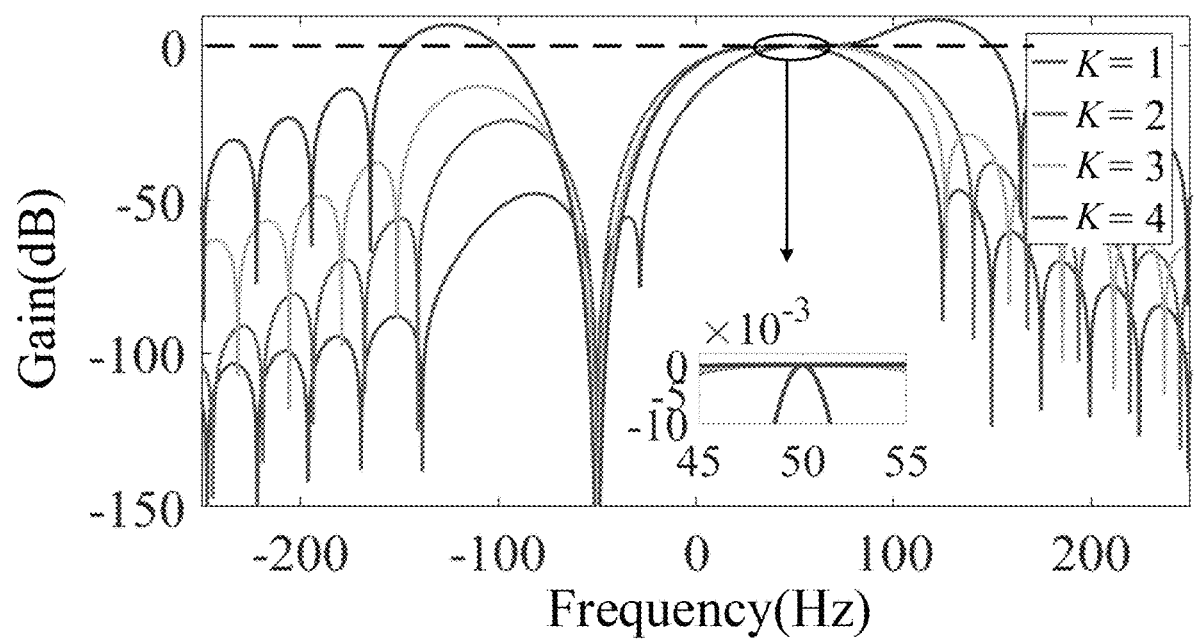
FIG. 2 shows exemplary magnitude response of PMF for different Taylor's series orders, Hann window, and $T_L=2$ cycles.
Figure 3:
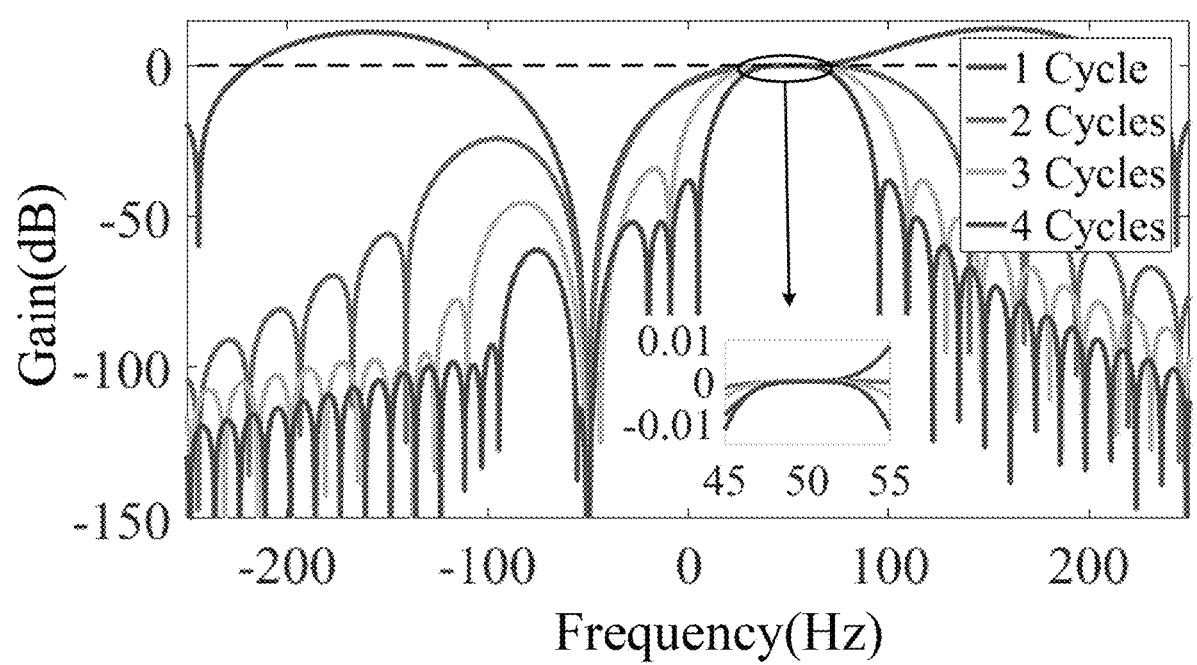
FIG. 3 shows exemplary magnitude response of PMF for different window lengths.

The PMF coefficients are determined by $f_s$, K, $T_L$, and w(•), but the measurement performance of PMF is unaffected by the change of sample frequency $f_s$. Therefore, different K, $T_L$, and w(•) are selected to design PMF. The design criteria of PMF include: 1) ensuring the dynamic performance first, indicating that the PMF gain must be flat in the measurement frequency band (45 Hz~55 Hz), and 2) guaranteeing the suppression effect on high-frequency interferences. On the premise of satisfying the above criteria, the suppression on low-frequency interferences can be properly considered.

a) Selection of Weighted Coefficients:

The two-term cosine window is commonly used as weighted coefficients. Thus, the Hann (maximum sidelobe decay), Hamming (minimum sidelobe level), and maximum image tone rejection (MIR) window coefficients are compared. FIG. 1 shows exemplary magnitude response of PMF for different weighted coefficients. Specifically, their PMF frequency responses are shown in FIG. 1, where K=2, $T_L$ is two cycles, and $f_s$=10 kHz. The PMFs with these three windows have almost the same passband gain, but the PMF with Hann window has the best suppression ability on high-frequency interferences. Therefore, the Hann window is selected as the weighted coefficients in this disclosure.

b) Selection of Taylor's Series Order:

FIG. 2 shows exemplary magnitude response of PMF for different Taylor's series orders, Hann window, and $T_L$=2 cycles. Specifically, the PMF frequency responses are provided in FIG. 2, where $T_L$=0.04 s (two cycles), Hann window (weighted coefficients), and $f_s$=10 kHz. When K=4, PMF may enlarge the $2^{nd}$ and $3^{rd}$ harmonics, causing fundamental phasor distortion. The PMF with K=1 has the best filtering performance, but gain attenuation in the measurement passband is largest, leading to bigger errors under off-nominal and dynamic conditions. The PMF gain with K=2 and K=3 has a small difference in the measurement bandwidth, but the interference suppression effect is better when K=2. Therefore, to ensure the dynamic accuracy and anti-interference ability, K=2 is optimal, compared with other Taylor's series orders.

c) Selection of Observation Window Length:

FIG. 3 shows exemplary magnitude response of PMF for different window lengths. Specifically, FIG. 3 shows the frequency responses of PMF under different $T_L$ when K=2. The PMF anti-interference ability becomes stronger with the increase of $T_L$, but the dynamic performance becomes worse. The PMF gain within the measurement bandwidth of 2 cycles has little difference compared with that of 3 cycles, but the interference suppression effect is better when $T_L$ is 3 cycles. Hence, $T_L$ is set as three cycles (0.06 s) to maintain the dynamic performance and anti-interference capability, compared with other window lengths.

2) Analysis on the Designed PMF

Figure 4:
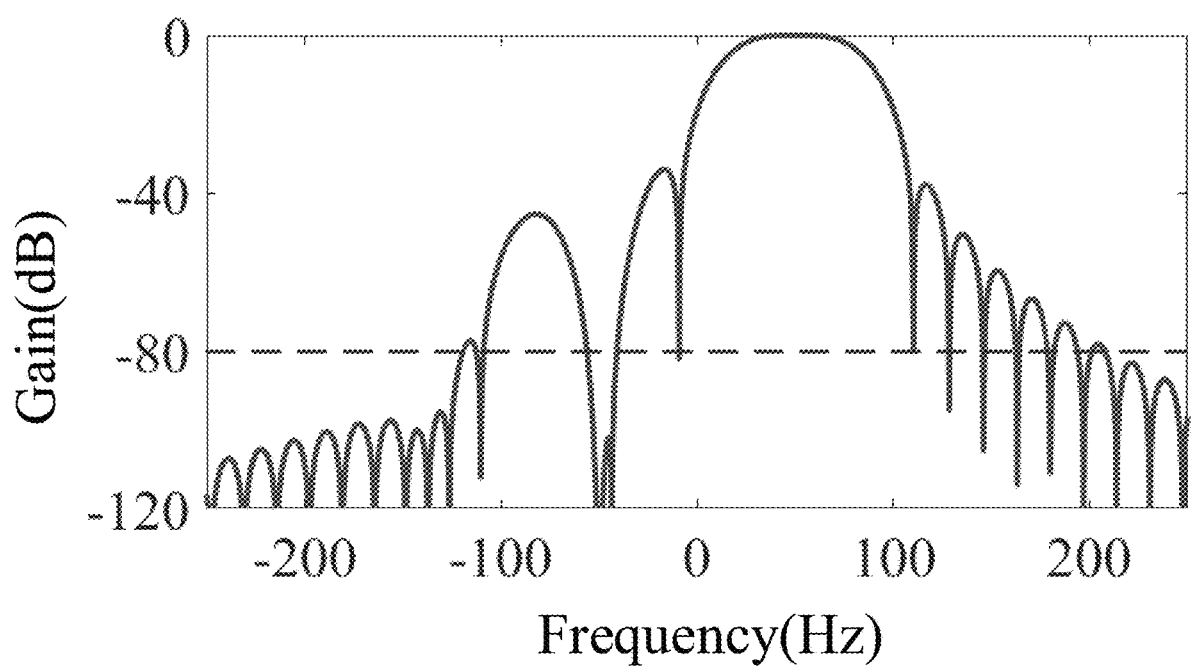
FIG. 4 shows exemplary magnitude response of the designed PMF.

FIG. 4 shows exemplary magnitude response of the designed PMF. According to the above analysis, K=2, Hann window, and three cycles are selected to design PMF coefficients, and their frequency response is depicted in FIG. 4. After designing PMF, the initial phasor can be obtained by (8). Then, the synchrophasor can be obtained by carrying out a frequency shift when it is reported to main stations at $t_k$:

$$\dot{X}_{t_k} = \dot{X}_c e^{-j2\pi f_n t_k} \qquad (21)$$

where $\dot{X}_{t_k}$ denotes the synchrophasor to be reported. Equation (21) indicates that if the frequency is $f_0$ Hz in the initial phasors, the frequency must be $(f_0-50)$ Hz in the synchrophasors. Thus, the frequency components of $\dot{X}_{t_k}$ are around 0 Hz.

The designed PMF can ensure dynamic performance while having good suppression for high-frequency interferences, but still has the following shortcomings:

a) Frequency Deviation:

The signal in (1) can be rewritten as $$x(t) = \frac{\sqrt{2}}{2} a(t) e^{j[2\pi f_n t + \varphi(t)]} + \frac{\sqrt{2}}{2} a(t) e^{-j[2\pi f_n t + \varphi(t)]} \qquad (22)$$
$$= x^+(t) + x^-(t)$$

where positive and negative image of the fundamental component are denoted by x+(t) and x−(t). x+(t) is the required phasor, and x⁻(t) is considered as an interference with a same amplitude as the phasor. Therefore, PMF must extract x⁺(t) and eliminate x⁻(t). However, under off-nominal conditions, the designed PMF passband gain attenuates slightly, resulting in the amplitude measurement error of x⁺(t), and the stopband cannot remove x⁻(t) effectively, which would cause $\dot{X}_{t_k}$ oscillate around $(-f_0-50)$ Hz.

b) Low-Frequency Interferences:

To avoid frequency aliasing during the phasor reporting, the interference components in the range of less than (50−$F_r$/2) Hz and over (50+$F_r$/2) Hz must be filtered. Due to the stricter requirements for interference tests in CHN Std., a filter gain of less than −80 dB is suggested to suppress the interferences. Thus, as shown in FIG. 4, the designed PMF cannot completely filter out most of the interferences in the frequency bands of −120 Hz~(50−$F_r$/2) Hz and (50+$F_r$/2) Hz~200 Hz. According to (21), the range of interference components existing in the synchrophasor become −170 Hz~−$F_r$/2 Hz and $F_r$/2 Hz~150 Hz.

From the above analysis, the designed PMF has two main problems:

Interferences in the frequency band of −170 Hz~−$F_r$/2 Hz and $F_r$/2 Hz~150 Hz, including (−$f_0$−50) Hz caused by x⁻(t) under off-nominal conditions, may cause phasor distortion and frequency aliasing during the phasor reporting; and The amplitude error of x⁺(t) may become larger due to the frequency offset.

C. Step 2: Design of Lowpass Filter Coefficients

1) Design Idea Analysis

For the first problem mentioned above, a lowpass filter is utilized to filter the frequency-shifting phasors to reject the low-frequency interferences. The filtering equation is given as $$\dot{X}'_{t_k} = \sum_{i=k}^{k+N_f} h_{1p}(i-k) \dot{X} t_k (i - N_f/2) \qquad (23)$$

where $N_f$ is the filter order, $h_{lp}(i)$ is the filter coefficients, and $\dot{X}_{t_k}'$ is the filtered phasor.

For the interferences in the synchrophasor, PMF has inferior suppression on low-frequency components than on high-frequency components. Therefore, the designed lowpass filter must focus on suppressing the interference components of ±$F_r$/2 Hz and the nearby frequency band.

Figure 5:
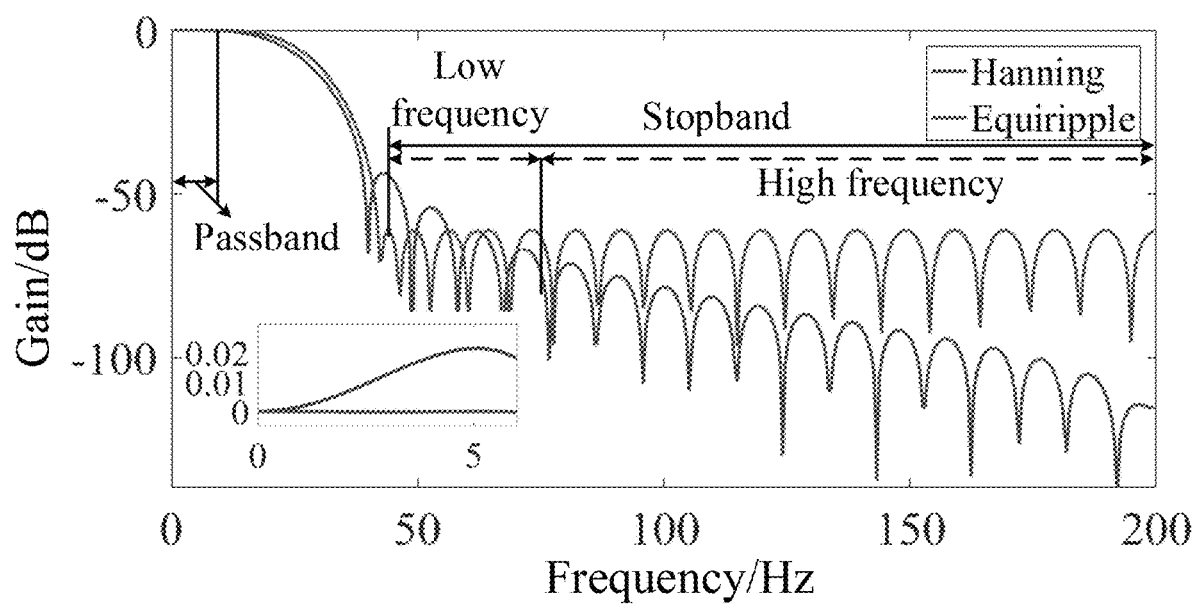
FIG. 5 shows exemplary diagram of a low-pass filter used to suppress the interferences in the frequency-shifting phasor.

FIG. 5 shows exemplary diagram of a low-pass filter used to suppress the interferences in the frequency-shifting phasor. Since the frequency response of real FIR filters is an even function of frequency, only the behavior for positive frequencies is provided in the diagram displayed in FIG. 5. Passband and stopband bandwidths are determined by the reporting rate of PMU. The maximum passband bandwidth is 0~min(5, $F_r$/5) Hz and stopband bandwidth is $F_r$/2~$F_c$/2 ($F_c$ is the computation rate). Window functions are commonly used to design filters, and in FIG. 5, the filter designed by Hann window is shown as the blue curve. It has good suppression ability on high-frequency interferences, but the suppression for low-frequency interferences is poor. The red curve is a filter designed using the equal ripple approximation method based on the maximum error minimization criterion. It improves the low frequency filtering effect by sacrificing the high-frequency suppression. Moreover, the gain ripple of "Equiripple" in the passband is small, resulting in smaller influence on the fundamental phasor accuracy. To achieve the same low-frequency suppression and passband gain, the "Hann" order must be increased, which may increase the response time. Furthermore, the frequency band gain can be customized in the equal ripple approximation method. Therefore, this paper uses equal ripple method to design the lowpass filter.

Different from PMF, the suppression effect on interference signals improves with the increase of filter order (equivalent to increasing data window) while the passband gain (and so the dynamic) performance is not affected, but the response time of the estimation algorithm will rise correspondingly. Therefore, the designed filter must take into account both measurement accuracy and response time.

2) Implementation of Lowpass Filter $\dot{X}_{t_k}$ is the filter object and its computation rate must be determined before designing the lowpass filter. From the analysis in the above section, the initial phasor obtained by PMF in (8) may contain interferences less than 200 Hz. Therefore, the computation rate $F_c$ must be greater than or equal to 400 Hz to avoid frequency aliasing. Because the maximum frequency is −170 Hz in $\dot{X}_{t_k}$, $F_c$ must be greater than 340 Hz. Hence, $F_c$ is set as 400 Hz in this disclosure.

Figure 6:
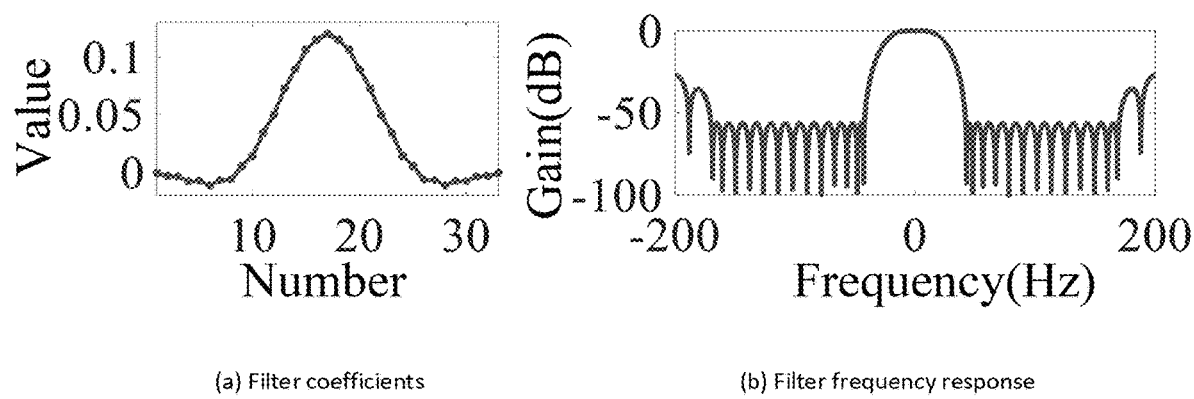
FIG. 6 shows exemplary coefficients and magnitude response of a designed lowpass filter used to suppress the interferences in the frequency-shifting phasor.

FIG. 6 shows exemplary coefficients and magnitude response of a designed lowpass filter used to suppress the interferences in the frequency-shifting phasor. According to the above analysis, the designed lowpass filter is displayed in FIG. 6, where $N_f=32$ and the frequency response is symmetrical about 0 Hz. In this disclosure, $F_r=100$ Hz, which is common reporting rate in China. As a result, the interferences to be filtered in $\dot{X}_{t_k}$ is −170 Hz∼−50 Hz and 50 Hz∼150 Hz. The filter passband ranges from −5.5 Hz to 5.5 Hz, and the ripple of passband gain is less than 0.004 dB, which has little influence on dynamic signals. The positive stopband ranges from 40 Hz to 200 Hz. The gain of 40 Hz∼170 Hz is smaller (<−56 dB), which has better suppression ability on low-frequency interferences. The interferences of 170 Hz∼200 Hz have been rejected by PMF, so the lowpass filter sets a larger gain in this frequency band. That is because the gain of this band becomes larger, which makes other stopband gain smaller and passband gain flatter, according to properties of the FIR filters. This is conducive to better suppression of low-frequency interferences. The negative stopband can be analyzed as the above due to spectral symmetry.

D. Step 3: Amplitude Correction for Frequency Deviation

In Step 1, the amplitude error of $x^+(t)$ may become larger under off-nominal conditions. Besides, the phasor amplitude is also affected by the passband gain fluctuation of the lowpass used. Because the amplitude is mainly determined by the PMF and lowpass gain at the fundamental frequency, it can be corrected as follows:

$$\hat{X}_c = \frac{\dot{X}'_{t_k}}{|H(\hat{f}_0)| \cdot |H_{lp}(\hat{f}_0 - 50)|} \quad (24)$$

where $\hat{f}_0$ is the estimated fundamental frequency (frequency estimation method is shown in Section IV), $|H(f)|$ and $|H_{lp}(f)|$ are the magnitude response of the designed PMF and lowpass filter, and $\hat{x}_c$ is the final synchrophasor.

Considering that the PMF and lowpass filter gain varies slightly in the measurement bandwidth, it is not necessary to calculate the gain at $\hat{f}_0$ in real time. The measurement bandwidth can be divided into L equal parts, then the gain of L+1 frequency points can be calculated offline and stored in PMU. The gain at the frequency closest to $\hat{f}_0$, is taken as the correction gain to reduce amplitude errors (L=40 in this disclosure). This action can reduce computation with minimal effect on amplitude accuracy.

IV. FREQUENCY AND ROCOF ESTIMATION

In the RWLS method, frequency and ROCOF can be obtained by Taylor's series coefficients, but their accuracy cannot meet the requirements in CHN Std. under off-nominal and dynamic conditions. Therefore, a frequency and ROCOF estimation method based on the filtering characteristics of LS method is presented. As frequency and ROCOF have the same solution processes, ROCOF estimation is provided as an example to derive the estimation processes.

A. ROCOF Estimation Based on Ls Method

To estimate the ROCOF of (1), the instantaneous signal frequency is at first estimated as the derivative of a second-order polynomial LS fitting of the phase angle returned by (13). A further second order-polynomial LS fitting is then applied to the obtained ROCOF estimates, as follows:

$$f(t)=d_0+d_1 t+d_2 t^2 \quad (25)$$

where $d_0$, $d_1$, and $d_2$ are polynomial coefficients, and can be obtained by LS method:

$$D=(P_f^T P_f)^{-1} P_f^T F \quad (26)$$

where F consists of M+1 adjacent measured frequencies (M is an even number), D is composed of polynomial coefficients ($D=[d_0, d_1, d_2]^T$), and $P_f$ is related to $F_c$ and M (see (27)).

$$P_f = \begin{bmatrix} 1 & t_{-M/2} & t^2_{-M/2} \\ 1 & t_{-(M-1)/2} & t^2_{-(M-1)/2} \\ \vdots & \vdots & \vdots \\ 1 & t_{M/2} & t^2_{M/2} \end{bmatrix} \quad (27)$$

where $t_I=I/F_c$ (I is an integer and $-M/2 \leq I \leq M/2$)

By setting the time tag in the center of the observation window, the signal ROCOF coincides with the derivative $d_1$ of (14). Of course, it can be observed that ROCOF can be obtained also as the second-order derivative of the phase angle polynomial fitting used to estimate the instantaneous signal frequency. However, simulations showed that such an approach provides poor accuracy under dynamic conditions. An approach that allows to improve ROCOF estimation accuracy is proposed in the next subsection.

B. Proposed ROCOF Estimation Method

The above method can estimate ROCOF accurately in the steady state, but will cause larger errors in the existence of power system oscillation. Therefore, a novel method based on the filtering characteristic of LS method is proposed to improve ROCOF accuracy under dynamic conditions.

The frequency and ROCOF of power oscillation can be expressed as:

$$f(t)=f_0-a_m \sin(2\pi f_m t+\varphi_p) \quad (28)$$

$$rf(t)=-b_m a_m \cos(2\pi f_m t+\varphi_p) \quad (29)$$

where $a_m=-f_m k_p$, $b_m=2\pi f_m$, and $f_m$, $k_p$ and $\varphi_p$ is the modulation frequency, depth and initial phase.

In (26), let $$Q_f = (P_f^T P_f)^{-1} P_f^T = \begin{bmatrix} q_{00} & q_{01} & \cdots & q_{0M} \\ q_{10} & q_{11} & \cdots & q_{1M} \\ q_{20} & q_{21} & \cdots & q_{2M} \end{bmatrix} = \begin{bmatrix} q_0 \\ q_1 \\ q_2 \end{bmatrix} \quad (30)$$

When $F_c$ and M are determined, $P_f$ and $Q_f$ can be calculated offline. As ROCOF is equal to $d_1$ in the observation window, its estimation equation can be rewritten as $$r\hat{f}(k) = \sum_{i=0}^{M} q_{1i} f(k-M/2+i) \quad (31)$$

Equation (31) is equivalent to using M order filter $q_1=[q_{10}, q_{11}, \ldots, q_{1M}]$ to filter measured frequencies f(k).

Figure 7:
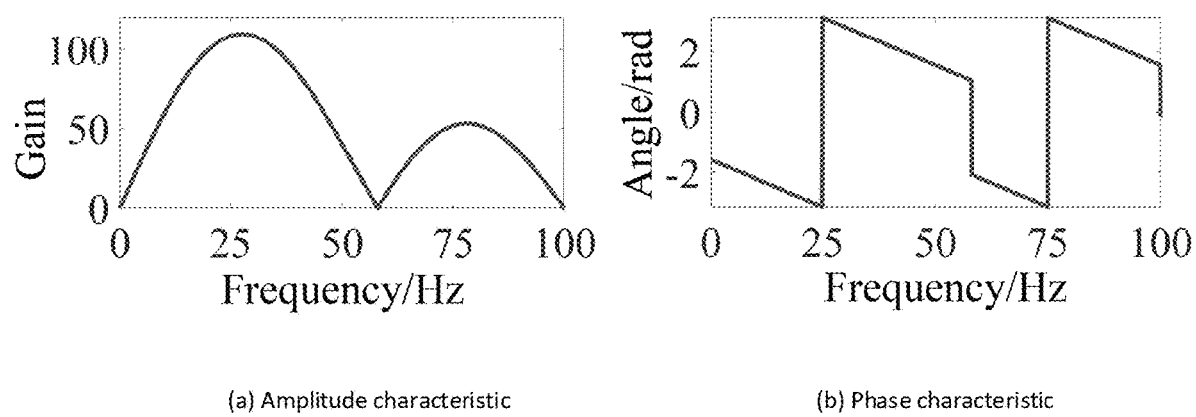
FIG. 7 shows exemplary frequency response of filter $q_1$ used to estimate ROCOF from the measured frequencies.

FIG. 7 shows exemplary frequency response of filter $q_1$ used to estimate ROCOF from the measured frequencies. Specifically, the frequency response of filter $q_1$ are displayed in FIG. 7 ($F_c=400$ Hz, M=6). The filter gain for the DC component is 0, the group phase delay is M/2, and the stationary phase delay in the low-frequency band is $-\pi/2$. According to FIR filter properties, the estimated ROCOF with time is:

$$\hat{rf}(t) = -|Q_1(f_m)| \cdot a_m \sin\left(2\pi f_m t + \varphi_p + \frac{\pi}{2}\right) \quad (32)$$
$$= -|Q_1(f_m)| \cdot a_m \cos(2\pi f_m t + \varphi_p)$$

where $|Q_1(f)|$ is the magnitude response of $q_1$. Then, ROCOF measurement errors can be expressed as $$e_{rf}(t) = rf(t) - \hat{rf}(t) \quad (33)$$
$$= -\left(\frac{b_m}{|Q_1(f)m|} - 1\right) \cdot |Q_1(f_m)| a_m \cos(2\pi f_m t + \varphi_p)$$

The errors are related to the modulation frequency $f_m$. If $e_{rf}(t)$ can be obtained, the ROCOF errors may be eliminated.

Using two-order polynomial to fit the estimated ROCOF, the second derivative of ROCOF can be obtained by:

$$c_2(k) = \sum_{i=0}^{M} q_{2i} \hat{rf}(k - M/2 + i) \quad (34)$$

Equation (34) is equivalent to utilizing filter $q_2$ in (30) to filter the ROCOF in (32). According to the spectrum characteristic of $q_2$ and the FIR filter properties, the expression of the second derivative in the time domain is:

$$c_2(t) = -|Q_2(f_m)||Q_1(f_m)| \cdot a_m \cos(2\pi f_m t + \varphi_p) \quad (35)$$

where $|Q_2(f)|$ denotes the magnitude response of $q_2$. Substituting (35) into (33), the ROCOF error can be rewritten as:

$$e_{rf}(t) = \left(\frac{b_m}{|Q_1(f_m)|} - 1\right) \cdot \frac{c_2(t)}{|Q_2(f_m)|} \quad (36)$$

Let $$K_2 = \left(\frac{b_m}{|Q_1(f_m)|} - 1\right) \cdot \frac{1}{|Q_2(f_m)|} \quad (37)$$

Figure 8:
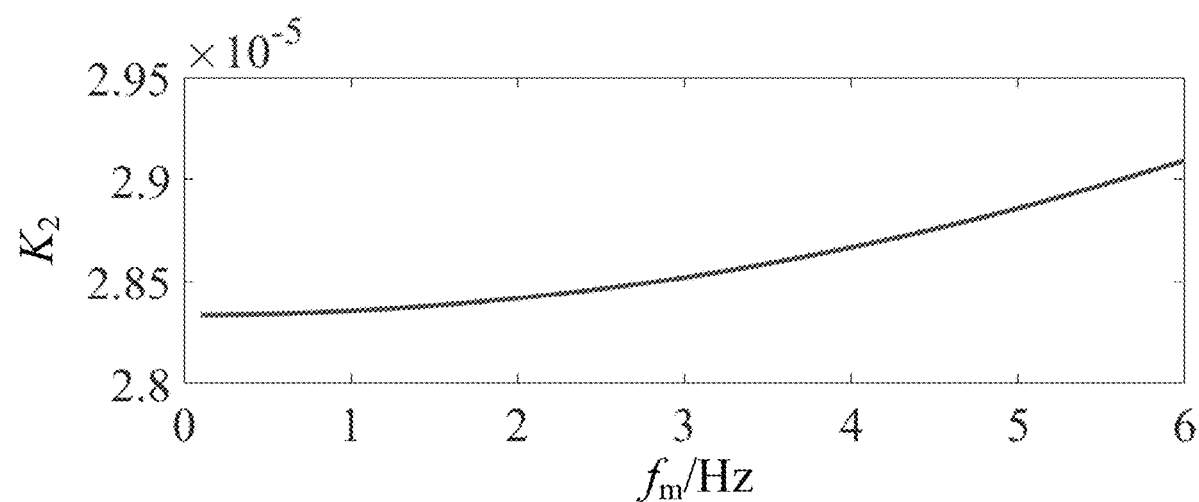
FIG. 8 shows exemplary change of $K_2$ with the increase of modulation frequency.

FIG. 8 shows exemplary change of $K_2$ with the increase of modulation frequency. As demonstrated in FIG. 8, the change of $K_2$ with modulation frequency is very small and its difference is $8 \times 10^{-7}$. Therefore, $K_2$ can be considered as a constant independent of modulation frequency (the constant is $2.85 \times 10^{-5}$ in this disclosure). The measurement error in (36) is approximately equal to multiplying the second derivative of ROCOF and $2.85 \times 10^{-5}$, and it can be eliminated as follows:

$$\hat{rf}_c(k) = \hat{rf} - 2.85 \times 10^{-5} c_2(k) \quad (38)$$

where $\hat{rf}_c(k)$ is the final estimated ROCOF.

The estimation process of ROCOF can be summarized as follows:
  First, the initial ROCOF is measured by (31) that uses $q_1$ to filter (M+1) estimated frequencies.
  Second, the second derivative of ROCOF is measured by (34) that uses $q_2$ to filter (M+1) initial ROCOFs.
  Third, according to the second derivative of ROCOF, the ROCOF error is corrected by (38), and then the final ROCOF is obtained.

The estimation process of frequency is the same as above, but the frequency is substituted into phase angle and ROCOF is substituted into frequency in (31), (34) and (38).

V. PERFORMANCE ASSESSMENT

A. Phasor Estimation Method Implementation
1) Data Window Analysis

FIG. 9 shows exemplary implementation flowchart of the phasor estimation method. For phasor estimation, the calculation window is determined by PMF and lowpass filter window. For frequency and ROCOF estimation, $q_1$ and $q_2$ filters contribute to their calculation windows. Thus, $$T_p = 2N \frac{1}{f_s} + N_f \frac{1}{F_c} \quad (39)$$

$$T_f = T_p + M \frac{1}{F_c} + M \frac{1}{F_c} \quad (40)$$

$$T_{rf} = T_f + M \frac{1}{F_c} + M \frac{1}{F_c} \quad (41)$$

where $T_p$, $T_f$ and $T_{rf}$ are the calculation window of phasor, frequency and ROCOF. In this research, $F_c$=400 Hz, $F_r$=100 Hz (commonly used reporting rate in China), $f_s$=10 kHz, $N_f$=32, and M=6. Therefore, $T_p$=140 ms (7 cycles), $T_f$=170 ms (8.5 cycles), and $T_{rf}$=200 ms (10 cycles). This means that the overall measurement latency is $T_{rf}/2$=100 ms (5 cycles), which is less than 140 ms.

2) Computational Burden

For the presented method, the phasor calculation includes PMF and lowpass filter, so estimating one phasor needs $(2N+1) \times 2 + (N_f+1) \times 2$ of multiplication and $2N \times 2 + N_f \times 2$ of addition. For frequency estimation, the computational of the proposed algorithm is $M \times 2$ of addition and $(M+1) \times 2$ of multiplication, which is the same as the computational of ROCOF estimation. Because $f_s$=10 kHz, $N_f$=32, M=6, and N=300, the computation for estimating one phasor, frequency and ROCOF is 1288 of addition and 1296 of multiplication.

B. Test Conditions

The presented method was compared with DFT-based demodulation algorithm (recommended by IEEE Std. and called DM), ITWLS (improved TWLS method) and RWLS methods to verify its advantages. To compare measurement performance of each algorithm under the same window lengths, the data window of all algorithm was 7 cycles. For other parameters, they were set as recommended. The Taylor series' order in RWLS was 2, and window coefficients were two-term MIR window. For ITWLS, the Taylor series' order was 2, and window coefficients were Hann window. In DM method, a FIR lowpass filter was also used and window function method was utilized to design coefficients. The recommended window function is Hamming window. The frequency and ROCOF estimation in DM method is based on the positive sequence phasor, which is suitable for three phase system. However, the proposed method and other two algorithms can be applied in single phase. As a result, DM method also estimates single phase phasor for comparison.

The static and dynamic test conditions according to an exemplary embodiments are shown in Table I, where $X_m$ is the voltage magnitude, $k_x$ is the amplitude modulation depth, $R_f$ is the frequency ramp rate, $k_{sx}$ is the amplitude step size, and $k_{sp}$ is the phase step size. In off-nominal test, the fundamental frequency varies from 45 Hz to 55 Hz with a step of 0.5 Hz, and test signals remain static at each frequency point. For harmonics tests, harmonics with amplitude of $0.1X_m$ and frequency of 2nd to 50th are superimposed on the fundamental signal, respectively. The fundamental frequency may offset ±0.5 Hz. In OOB tests, the superimposed inter-harmonics include 102 Hz, 105 Hz, 110 Hz, 115 Hz and 120 Hz and their amplitude is $0.1X_m$. The $f_0$ is also 49.5 Hz, 50 Hz and 50.5 Hz, respectively. Modulation tests include AM, PM and combined modulation tests (AM+PM). The amplitude and phase of test signals change sinusoidally, and modulation frequency changes from 1 Hz to 5 Hz with 0.5 Hz step. The signal amplitude remains unchanged, and the frequency changes between 45 Hz and 55 Hz at a linear rate of ±1 Hz/s in frequency ramping test. Besides, the step test signals are static with nominal frequency before and after step.

In the simulation, sampled data are generated by using MATLAB at $f_s$=10 kHz, and theoretical values of phasor, frequency and ROCOF are produced, according to the exemplary embodiments. The maximum errors are obtained by comparing measurements with the theoretical values.

TABLE I

STATIC AND DYNAMIC CONDITIONS

| Test types | Range of signal parameters |
|---|---|
| Off-nominal | $X_m$ = 57.73 V, 45 Hz ≤ $f_0$ ≤ 55 Hz |
| Harmonics | $X_m$ = 57.73 V, $f_0$ = 49.5 Hz, 50 Hz, 50.5 Hz; harmonic magnitude is $0.1X_m$, frequency is up to 50th |
| Out-of-band (OOB) | $X_m$ = 57.73 V, $f_0$ = 49.5 Hz, 50 Hz, 50.5 Hz; inter-harmonic magnitude is $0.1X_m$, frequencies are 102 Hz, 105 Hz, 110 Hz, 115 Hz and 120 Hz |
| Modulation | $X_m$ = 57.73 V, $f_0$ = 49.5 Hz, 50 Hz, 50.5 Hz, 1 Hz ≤ $f_m$ ≤ 5 Hz; AM: $k_x$ = 0.1, $k_p$ = 0, PM: $k_x$ = 0, $k_p$ = 0.1, AM + PM: $k_x$ = 0.1, $k_p$ = 0.1 |
| Frequency ramp | $X_m$ = 57.73 V, $f_0$ = 45 Hz ~ 55 Hz, $R_f$ = ±1 Hz/s |
| Step | Amplitude step: $k_{sx}$ = ±$0.1X_m$, $k_{sp}$ = 0; phase step: $k_{sx}$ = 0, $k_{sp}$ = ±π/18 |

TABLE II

MAXIMUM MEASUREMENT ERRORS IN OFF-NOMINAL TESTS

| Method | AE (%) | PE (°) | TVE (%) | FE (Hz) | RFE (Hz/s) |
|---|---|---|---|---|---|
| RWLS | 0.955 | 0.001 | 1.158 | 0.737 | 0.020 |
| ITWLS | $1.2 \times 10^{-12}$ | $1.0 \times 10^{-11}$ | $1.8 \times 10^{-11}$ | $3.3 \times 10^{-10}$ | $1.1 \times 10^{-11}$ |
| DM | 0.053 | 0.033 | 0.064 | 0.003 | 0.093 |
| Proposed | $8.9 \times 10^{-6}$ | $6.2 \times 10^{-6}$ | $1.1 \times 10^{-5}$ | $6.4 \times 10^{-9}$ | $1.7 \times 10^{-7}$ |
| CHN | 0.2 | 0.2 | — | 0.002 | 0.01 |
| IEEE | — | — | 1 | 0.005 | 0.1 |

C. Simulation Verification
1) Off-Nominal Tests

The actual frequency of power systems deviates from the nominal value, and it often offsets greatly when faults occur. Off-nominal test is used to test the accuracy of phasor estimation algorithms at different frequency. The maximum measurement errors of each algorithm are shown in Table II, where AE is amplitude error, PE is phase error, TVE is total vector error, FE is frequency error, and RFE is ROCOF error. The RWLS considers the fundamental frequency as the nominal frequency, leading to larger measurement errors for frequency deviations. ITWLS adjusts the reference frequency based on IpDFT method, and is therefore unaffected by off-nominal. The designed lowpass filter in DM method cannot remove $x^-(t)$ (the negative fundamental component), and thus FE and RFE are larger than CHN Std. As the presented algorithm filters out $x^-(t)$ and corrects the amplitude error based on PMF and lowpass filter gain, the measurement errors are smaller than those of RLWS, and at least four orders of magnitude lower than standard requirements.

2) Harmonic Distortion and OOB Tests

With the wide application of power electronic equipment, many harmonics and inter-harmonics exist in systems. Harmonic testing is applied to verify the capability of phasor algorithms to eliminate harmonics. In addition, frequency aliasing must be caused during reporting phasors if phasor estimation methods cannot suppress inter-harmonics with the frequency band of $0\sim(50-F_r/2)$ Hz and over $(50+F_r/2)$ Hz. OOB test is utilized to verify the filtering effect of phasor algorithms for out-of-band interferences. As illustrated in Table III and IV, the three methods display little difference for phasor errors. However, the accuracy of the proposed method is slightly better than that of RWLS and ITWLS, under the same observation window length. The RFEs of RWLS and ITWLS exceed the requirements in CHN Std. for harmonic distortion tests. For DM method, harmonics and inter-harmonics can be rejected but $x^-(t)$ cannot be suppressed completely, causing that the DM accuracy can meet requirements but AE and PE are more than other methods. Nevertheless, the designed lowpass filter can remove low-frequency interferences, and thus the measurement errors of the proposed method are at least one order of magnitude lower than the requirements in harmonic tests, and two orders of magnitude lower than the requirements in OOB tests.

TABLE III

MAXIMUM MEASUREMENT ERRORS IN HARMONIC TESTS

| Method | AE (%) | PE (°) | TVE (%) | FE (Hz) | RFE (Hz/s) |
|---|---|---|---|---|---|
| RWLS | 0.004 | 0.003 | 0.005 | 0.001 | 0.037 |
| ITWLS | 0.003 | 0.002 | 0.004 | $2.0 \times 10^{-4}$ | 0.033 |
| DM | 0.031 | 0.023 | 0.042 | $4.2 \times 10^{-4}$ | 0.004 |
| Proposed | 0.002 | 0.002 | 0.003 | $3.0 \times 10^{-5}$ | 0.002 |
| CHN | 0.4 | 0.4 | — | 0.004 | 0.02 |
| IEEE | — | — | 1 | 0.025 | N/A |

TABLE IV

MAXIMUM MEASUREMENT ERRORS IN OOB TESTS

| Method | AE (%) | PE (°) | TVE (%) | FE (Hz) | RFE (Hz/s) |
|---|---|---|---|---|---|
| RWLS | 0.004 | 0.003 | 0.005 | 0.001 | 0.041 |
| ITWLS | 0.004 | 0.003 | 0.005 | $1.3 \times 10^{-4}$ | 0.040 |
| DM | 0.038 | 0.025 | 0.047 | 0.001 | 0.020 |
| Proposed | 0.001 | 0.001 | 0.001 | $3.1 \times 10^{-5}$ | 0.001 |
| CHN | 0.5 | 1 | — | 0.025 | N/A |
| IEEE | — | — | 1.3 | 0.01 | N/A |

3) Modulation Tests

Modulation tests are used to simulate the waveform of power system oscillation. Table V shows the maximum estimation errors in amplitude and phase modulation (AM+PM) tests. The estimation accuracy of RWLS and ITWLS show a slight difference, and their RFEs exceed the requirements in CHN Std. The designed lowpass filter passband of DM method is flatter than RWLS and ITWLS, but not flatter than the proposed method. Therefore, the phasor accuracy of DM method is better than RWLS and ITWLS but worse than the proposed method. In the same observation window length, the proposed method displays superior measurement accuracy. The measurement errors are at least 28 times lower than the requirements in CHN Std., and at least two orders of magnitude lower than the requirements in IEEE Std.

TABLE V

MAXIMUM MEASUREMENT ERRORS IN MODULATION TESTS

| Method | AE (%) | PE (°) | TVE (%) | FE (Hz) | RFE (Hz/s) |
|---|---|---|---|---|---|
| RWLS | 0.120 | 0.095 | 0.188 | 0.095 | 3.087 |
| ITWLS | 0.116 | 0.092 | 0.181 | 0.081 | 3.102 |
| DM | 0.035 | 0.028 | 0.049 | 0.071 | 4.153 |
| Proposed | 0.007 | 0.005 | 0.011 | $6.9 \times 10^{-4}$ | 0.042 |
| CHN | 0.2 | 0.5 | — | 0.3 | 3 |
| IEEE | — | — | 3 | 0.3 | 14 |

TABLE VI

MAXIMUM MEASUREMENT ERRORS IN FREQUENCY RAMP TESTS

| Method | AE (%) | PE (°) | TVE (%) | FE (Hz) | RFE (Hz/s) |
|---|---|---|---|---|---|
| RWLS | 0.953 | 0.023 | 1.156 | 0.737 | 0.133 |
| ITWLS | $1.3 \times 10^{-6}$ | $3.4 \times 10^{-7}$ | $1.5 \times 10^{-4}$ | $5.1 \times 10^{-8}$ | $9.1 \times 10^{-6}$ |
| DM | 0.061 | 0.041 | 0.074 | 0.004 | 0.118 |
| Proposed | 0.001 | 0.002 | 0.003 | $2.8 \times 10^{-6}$ | $1.2 \times 10^{-5}$ |
| CHN | 0.2 | 0.5 | — | 0.01 | 0.2 |
| IEEE | — | — | 1 | 0.01 | 0.2 |

TABLE VII

RESPONSE TIME IN AMPLITUDE STEP TESTS

| Method | AE (ms) | PE (ms) | TVE (ms) | FE (ms) | RFE (ms) |
|---|---|---|---|---|---|
| RWLS | 84 | 27 | 30 | 87 | 111 |
| ITWLS | 84 | 26 | 31 | 88 | 111 |
| DM | 70 | 27 | 23 | 102 | 133 |
| Proposed | 52 | 19 | 17 | 76 | 117 |
| CHN | 70 | 70 | — | 280 | 280 |
| IEEE | — | — | 140 | 280 | 280 |

TABLE VIII

RESPONSE TIME IN PHASE STEP TESTS

| Method | AE (ms) | PE (ms) | TVE (ms) | FE (ms) | RFE (ms) |
|---|---|---|---|---|---|
| RWLS | 39 | 88 | 34 | 106 | 118 |
| ITWLS | 43 | 88 | 35 | 106 | 120 |
| DM | 37 | 72 | 28 | 123 | 146 |
| Proposed | 32 | 55 | 26 | 91 | 134 |
| CHN | 70 | 70 | — | 280 | 280 |
| IEEE | — | — | 140 | 280 | 280 |

4) Frequency Ramp Tests

Frequency ramping test is used for simulating power system out-of-step process. As shown in Table VI, RWLS is sensitive to frequency deviation and its accuracy cannot meet the standard requirements. ITWLS can adjust the reference frequency by IpDFT method, so its accuracy is the best. DM method is affected by frequency offset, but its accuracy is better than RWLS and can meet requirements. The presented method reduces the influence of frequency offset by amplitude correction and PRF, and its errors are at least 2 orders of magnitude lower than the requirements in CHN and IEEE Std.

5) Step Tests

When faults or switching operations occur in the power system, the amplitude and phase of voltage and current waveforms must change abruptly. Step test is used to verify the response speed of phasor estimation algorithms in step processes. As shown in Table VII and VIII, the response time of RWLS is similar to that of ITWLS. In the same observation window length, the response time of the proposed method is less than that of RWLS and ITWLS, with the exception of ROCOF. Due to calculating the second derivative of ROCOF, the response time is longer than that of RWLS and ITWLS. Although lowpass filters are used in the proposed algorithm and DM method, the response time of DM method is longer. The amplitude and phase response time of DM, RWLS and ITWLS exceeds the requirements in CHN Std., but that of the proposed method meets the standard requirements.

6) Computation Comparison

The computational cost of the presented method has been analyzed, and compared to that of RWLS and ITWLS. The calculation rate of the presented method is set as 400 Hz to avoid frequency aliasing, but those of DM, RWLS and ITWLS method are equal to the reporting rate of 100 Hz. Therefore, comparing the computational of estimating one measurement is not comprehensive. The total time spent by each algorithm in measuring 1 s signal is utilized to compare the computational cost. The software is MATLAB2016a, and the computer is Windows 10 system with 3.0 GHz and 8 G RAM. Each algorithm tests 100 times, and its average value is taken as results shown in Table IX.

Because the frequency and ROCOF estimation is based on Taylor series coefficients in RWLS and ITWLS methods, their computation time is the same as that of estimating phasor. In addition, IpDFT is used to calculate the fundamental frequency in ITWLS method, and thus ITWLS computation time is longest. The computational complexity of DM is the same as that of RWLS for phasor estimation, but the difference method based on measured phase (the computational burden can be negligible) is used to estimate frequency and ROCOF. Therefore, the computation time of DM method is shortest. Although the calculation rate of the presented algorithm is relatively higher, the computational complexity for estimating one phasor is smaller than RWLS and ITWLS under the same window length. Thus, the total running time of the proposed method is still shorter than RWLS and ITWLS methods.

TABLE IX

CALCULATION TIME OF EACH ALGORITHMS

| | Proposed | RWLS | ITWLS | DM |
|---|---|---|---|---|
| Time (ms) | 7.3 | 9.9 | 19.9 | 5.0 |

In conclusion, RWLS is affected by frequency deviation, and ITWLS uses IpDFT method to avoid its sensitivity to frequency deviation. These two methods have a better anti-interference ability with a longer observation window length, but their dynamic performance declines, and estimation accuracy cannot meet the CHN Std. in some cases. In the same data window length, the proposed improved TWLS method spends less computation time to obtain higher accuracy measurements under interference and dynamic conditions. Compared with RWLS and ITWLS, the measurement accuracy of the presented method meets the requirements stipulated in IEEE and CHN Std. DM method is recommended in IEEE Std., but its accuracy cannot meet CHN Std. in some cases. The performance of the designed lowpass filter is inferior to that of the presented method. To conclude, the presented method has better measurement performance.

7) Combined Tests

In addition to the above tests specified in PMU standards, interference signals such as decaying DC component and noise also exist in actual power system. Thus, the estimation accuracy of the presented method under these interferences must be tested.

a) Decaying DC Component

Figure 10:
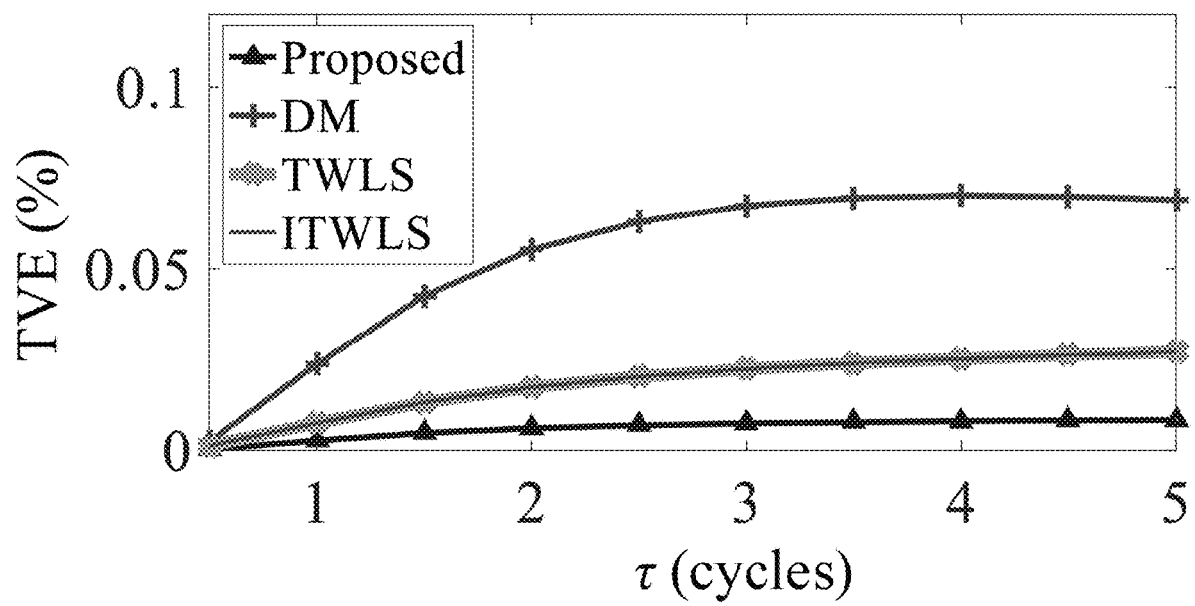
FIG. 10 shows exemplary phasor errors of different methods for different time constants of decaying direct current.
Figure 11:
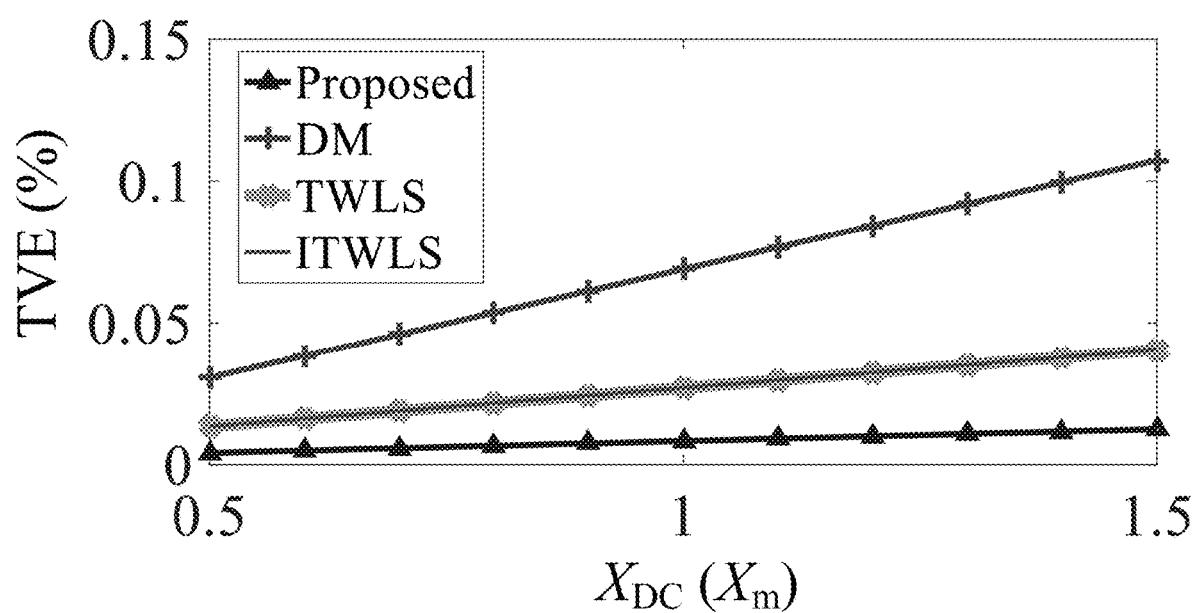
FIG. 11 shows exemplary phasor errors of different methods for different magnitudes of decaying direct current.

FIG. 10 shows exemplary phasor errors of different methods for different time constants of decaying direct current. FIG. 11 shows exemplary phasor errors of different methods for different magnitudes of decaying direct current. Specifically, the decaying DC components of different time constants and magnitudes are added to the fundamental signals, and then test results are shown in FIG. 10 and FIG. 11. In FIG. 10, r denotes the time constant, and its variation range is from 0.5 cycles to 5 cycles. The magnitude of decaying DC component is equal to the fundamental amplitude. The phasor errors of different methods raise with the increase of time constants. The phasor error of DM method is the largest, and the difference of the phasor error between TWLS and ITWLS methods is very small. The TVE of the presented method is the smallest and less than 0.009%. In FIG. 11, $X_{DC}$ is the magnitude of decaying DC component, and it has a variation range of $0.5X_m \sim 1.5X_m$. The time constant is 5 cycles. With the increase of $X_{DC}$, the phasor accuracy declines. The phasor error of the presented algorithm is still the smallest. The TVE is 0.013% and less than the standard requirement of 1%. Therefore, the presented algorithm has better capability to suppress decaying DC component.

b) Noise Tests

Figure 12:
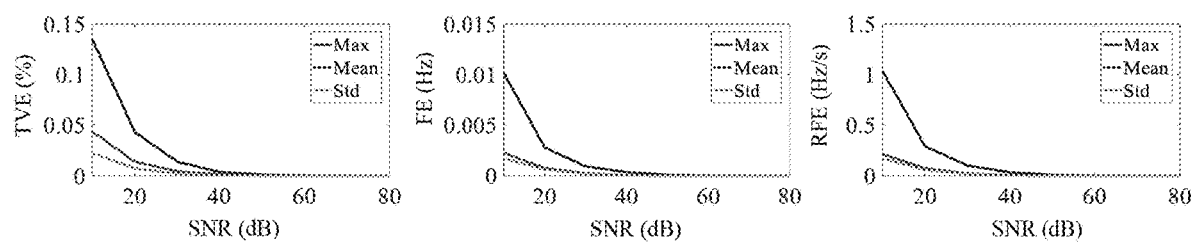
FIG. 12 shows exemplary test results of the presented method under different noise levels.

FIG. 12 shows exemplary test results of the presented method under different noise levels. Different random noise levels (10 dB to 80 dB) are superposed into the fundamental signal. The test results are shown in FIG. 12, where SNR denotes signal-to-noise ratio, "Max" is the maximum error, "mean" is the average error, and "Std." is the standard error. The measurement errors of the presented method decrease with the increase of SNR. The TVE at 10 dB is 0.14% and less than 1% in IEEE Std., indicating that the phasor accuracy affected by noise is small. The frequency and ROCOF are derived from the phase angle. From the previous analysis, the derivation process may amplify the interference components. Thus, the accuracy of the frequency and ROCOF is greatly affected by noise. The FE is not less than the standard requirement of 0.005 Hz until 20 dB, where FE is 0.003 Hz. The RFE is not less than the error limitation (0.1 Hz/s) until 30 dB, where RFE is 0.08 Hz/s. Therefore, the estimation accuracy is better than the requirements when SNR is greater than 30 dB, which shows that the proposed method has a good anti-noise capability.

c) Combined Signals

An artificial signal was generated as follows:

$$y(t) = X_E e^{-t/\tau} + x(t) + \xi(t) + 60 \text{ dB noise} \quad (42)$$

where $X_E$ is the initial value of DC attenuation component ($X_E = X_m$), $\tau$ is the decay time ($\tau = 0.5$ s); $x(t)$ is an amplitude and phase modulation test (parameters listed in Table I); $\xi(t)$ is the harmonic signals, including second and third harmonics (harmonic magnitude is $0.2X_m$); and noise content is obtained from. This test is not specified in IEEE and CHN Std.

Figure 13:
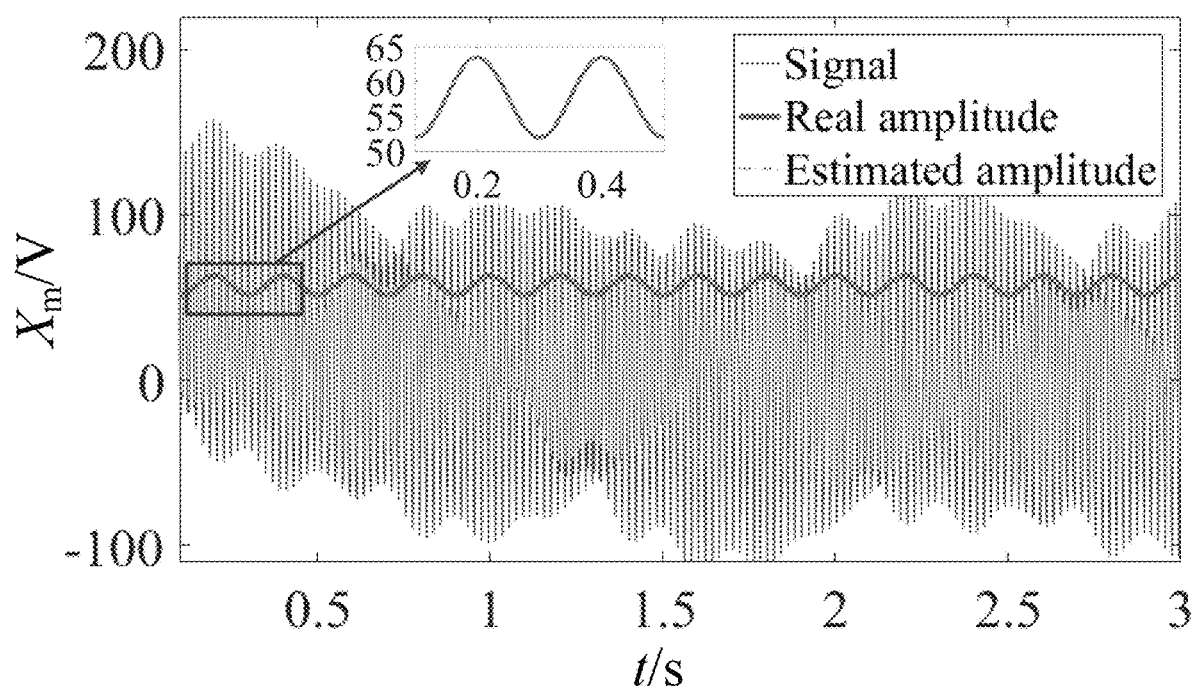
FIG. 13 shows exemplary measured amplitude of the presented method in artificial signal tests.

FIG. 13 shows exemplary measured amplitude of the presented method in artificial signal tests. Here, the test signal is seriously distorted but the estimated amplitude coincides with the real amplitude. The proposed method can remove interferences and estimate the dynamic phasor accurately. The maximum errors of the presented method are 0.01% in TVE, 0.0075% in AE, 0.0058° in PE, 0.001 Hz in FE, and 0.049 Hz in RFE. Therefore, the presented method has an improved measurement performance even with the existence of DC component, harmonics and random noise.

D. Experimental Verification

FIG. 14 shows exemplary equipment for evaluating the performance of a PMU prototype. For experimental verification, NI 9467, NI 9244, NI 9246, and NI cRIO 9039 from National Instruments (NI) were selected to build a PMU prototype 1410. The NI 9467 is a synchronous timing board 1411, NI 9244 and 9246 are voltage acquisition board 1412 and current acquisition board 1413, and NI cRIO 9039 is a real-time embedded controller 1414.

A calibrated high precision generator 1415 was used to test the built PMU prototype under static and dynamic conditions. The GPS receiver 1416 sent synchronous signals to the signal generator OMICRON 256-plus and PMU prototype simultaneously. The generator sent the test signals to the PMU prototype, according to test signal models described above. At the same time, the theoretical values of phasor, frequency and ROCOF were generated according to signal models and displayed on display 1417. Then, the PMU prototype sampled test signals and estimated measurements. The measurement errors of PMU prototype were obtained by comparing the theoretical values with measurements.

The test results are listed in Table X and XI. Due to the uncertainty of the test system and PMU hardware error, the measurement results were inferior to the simulation results. However, the maximum estimation errors are below the requirements in IEEE and CHN Std. The tests results conclude that the built PMU prototype can estimate the fundamental components accurately.

TABLE X

MAXIMUM PHASOR ERRORS UNDER STATIC AND DYNAMIC CONDITIONS

| Test types | AE (%) | | PE (°) | | TVE (%) | |
| --- | --- | --- | --- | --- | --- | --- |
| | Proposed | CHN | Proposed | CHN | Proposed | IEEE |
| Off-nominal | $3.4 \times 10^{-3}$ | 0.2 | $2.4 \times 10^{-3}$ | 0.2 | $5.2 \times 10^{-3}$ | 1 |
| Harmonic | $3.5 \times 10^{-3}$ | 0.4 | $2.3 \times 10^{-3}$ | 0.4 | $6.1 \times 10^{-3}$ | 1 |
| OOB | $4.0 \times 10^{-3}$ | 0.5 | $2.7 \times 10^{-3}$ | 1 | $7.1 \times 10^{-3}$ | 1.3 |
| AM + PM | $8.1 \times 10^{-3}$ | 0.2 | $5.4 \times 10^{-3}$ | 0.5 | 0.012 | — |
| Frequency ramp | $6.3 \times 10^{-3}$ | 0.2 | $2.3 \times 10^{-3}$ | 0.5 | 0.010 | 1 |

TABLE XI

MAXIMUM FE AND RFE UNDER STATIC AND DYNAMIC CONDITIONS

| Test types | FE (Hz) | | | RFE (Hz/s) | | |
| --- | --- | --- | --- | --- | --- | --- |
| | Proposed | CHN | IEEE | Proposed | CHN | IEEE |
| Off-nominal | $3.2 \times 10^{-5}$ | 0.002 | 0.005 | 0.002 | 0.01 | 0.1 |
| Harmonic | $5.9 \times 10^{-5}$ | 0.004 | 0.025 | 0.003 | 0.02 | — |
| OOB | $6.3 \times 10^{-5}$ | 0.025 | 0.01 | — | — | — |
| AM + PM | $7.8 \times 10^{-4}$ | 0.3 | — | 0.045 | 3 | — |
| Frequency ramp | $1.2 \times 10^{-4}$ | 0.01 | 0.01 | 0.006 | 0.2 | 0.2 |

E. Recorded Data Verification

Figure 15:
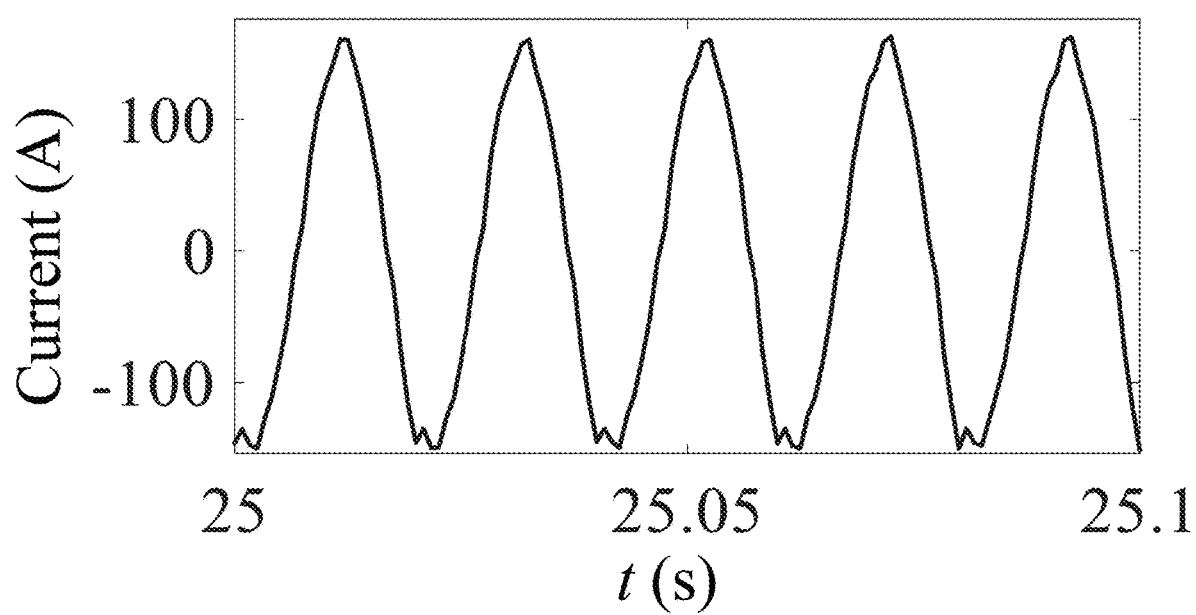
FIG. 15 shows exemplary field recorded current signal.
Figure 16:
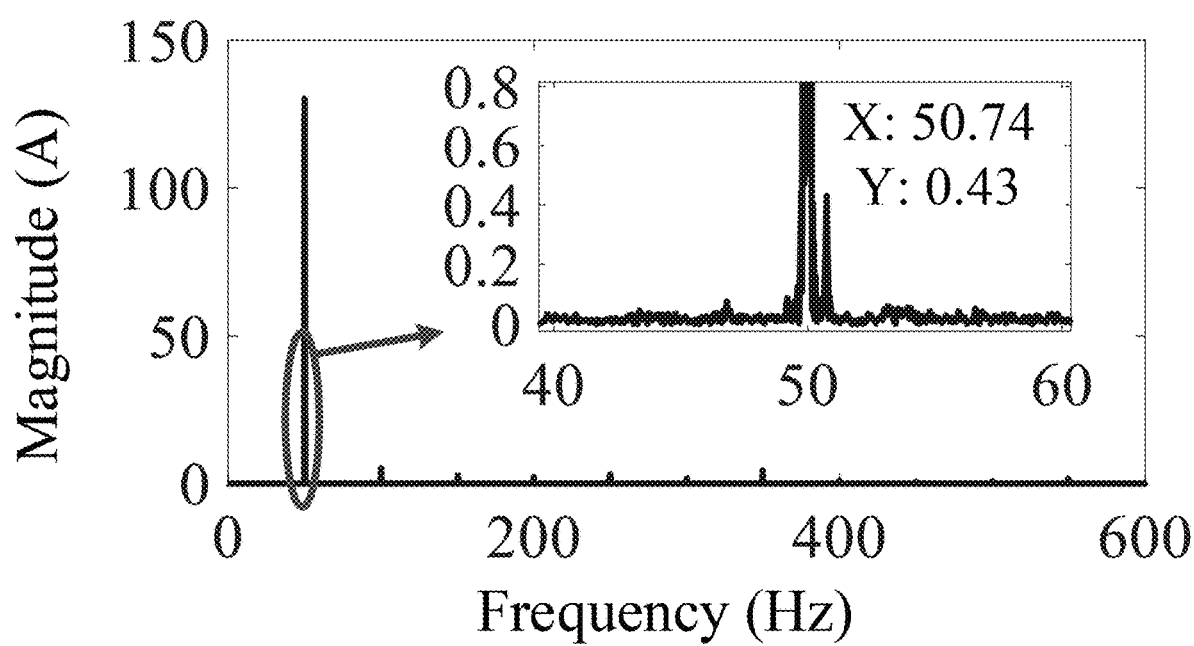
FIG. 16 shows exemplary spectrum analysis of recorded current signal.

FIG. 15 shows exemplary field recorded current signal. FIG. 16 shows exemplary spectrum analysis of recorded current signal. To test the application effect of the presented algorithm in the actual system, the recorded data of the low-frequency oscillation occurring in a regional power grid of China is used. The recorded current data is displayed in FIG. 15. The current signal is distorted, indicating that the signal contains other interference components besides the fundamental wave. Through spectrum analysis (see FIG. 16), there are a lot of harmonics in the signal. In addition, due to the 0.74 Hz low-frequency oscillation, the signal also contains 50.74 Hz frequency component.

Figure 17:
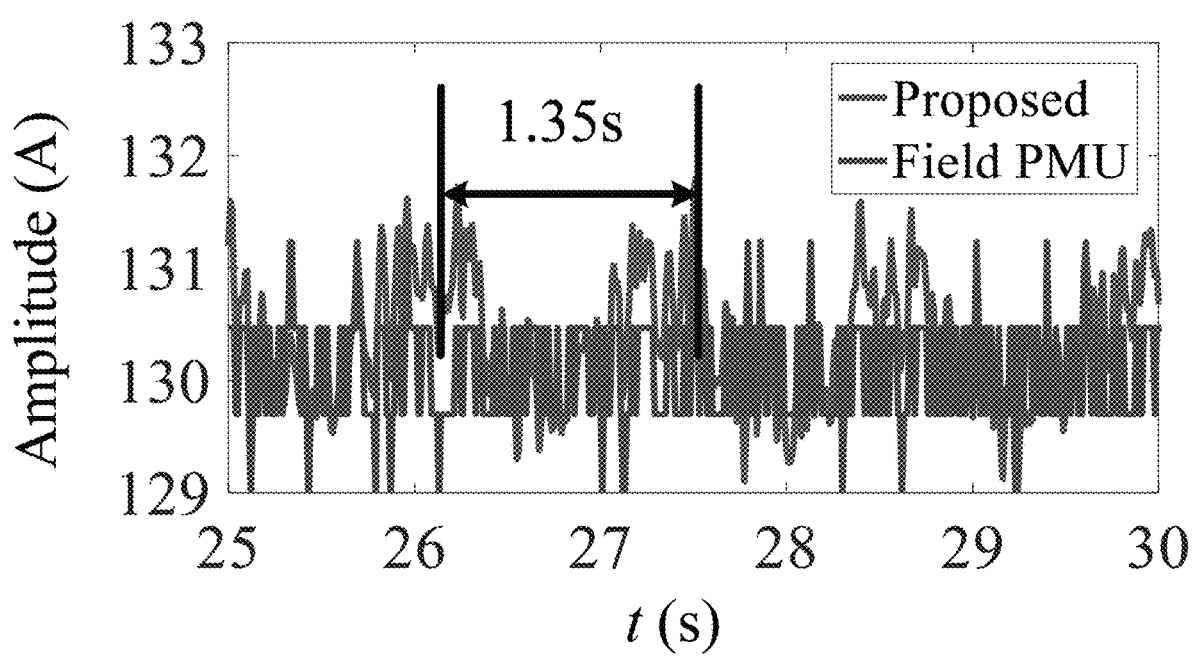
FIG. 17 shows exemplary estimated amplitude of the presented method and field PMU.

FIG. 17 shows exemplary estimated amplitude of the presented method and field PMU. The presented method is used to measure the recorded data. The measurement results are shown in FIG. 17, and the phasor amplitude from a field PMU are compared. The amplitude of the field PMU is basically stable and does not change with time. The amplitude of the proposed method oscillates, and the oscillation period is 1.35 s, which is consistent with the low-frequency oscillation of 0.74 Hz. It should be noted that the small jitter in the measured amplitude is caused by the noise in the signal. Therefore, the presented method can track dynamic signals and can be applied to actual power systems.

VI. CONCLUSION

In this disclosure, a high-accuracy phasor estimation method based on algorithm filtering characteristic analysis was presented to improve TWLS method. This method solves the shortcomings of TWLS by three steps:

According to RWLS filtering characteristics, the optimal weighted coefficients, Taylor's series order, and observation window length were selected to design the proposed PMF. The PMF gives priority to dynamic measurement performance and has strong suppression of high-frequency interferences.

A FIR lowpass filter was designed to filter low-frequency interferences in the frequency-shifting phasor obtained by the designed PMF, avoiding frequency aliasing and phasor distortion during reporting phasors.

The amplitude is corrected based on the filtering gain of the designed PMF and lowpass filter under off-nominal conditions.

In addition, a high-accuracy frequency and ROCOF estimation method was presented based on the filtering characteristics of LS method. Simulation and experimental test results show that the presented method meets IEEE and CHN Std., and can obtain high accuracy with low computational complexity under off-nominal, dynamic and interference conditions. Compared with some improved TWLS methods, the presented method can give consideration of dynamic and anti-interference performance in the same data window.

Technical Implementation of the Computer System

Figure 18:
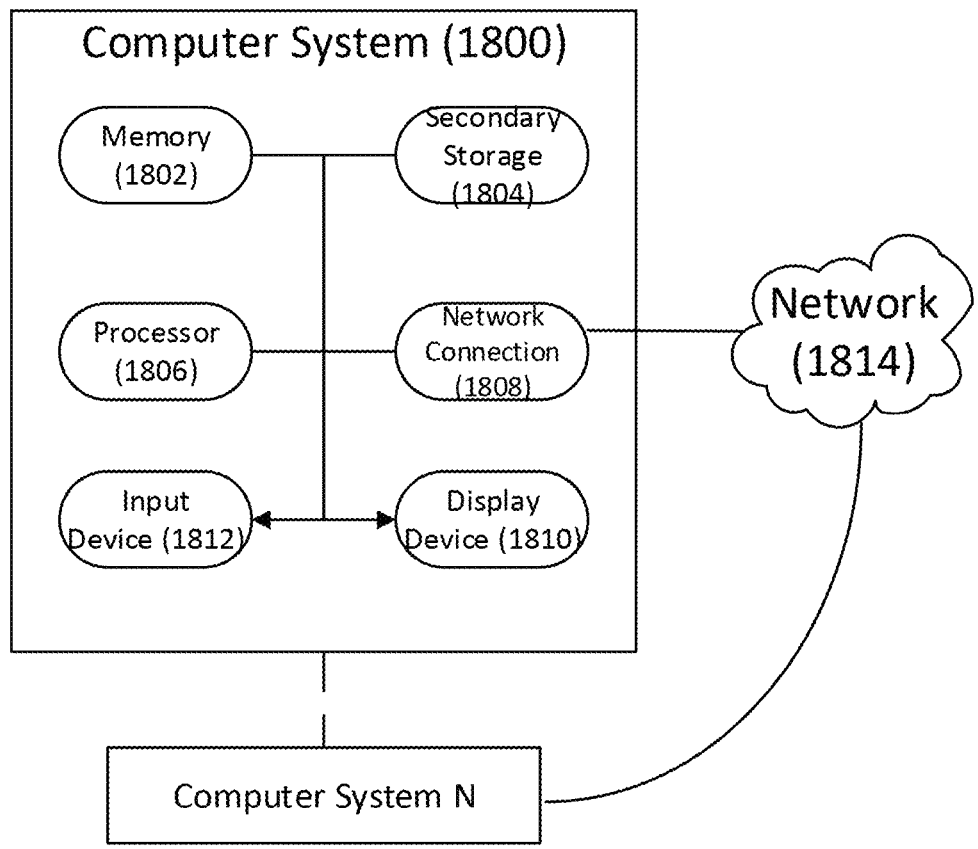
FIG. 18 illustrates exemplary hardware components for a server.

FIG. 18 illustrates exemplary hardware components of a server. A computer system 1800, or other computer systems similarly configured, may include and execute one or more subsystem components to perform functions described herein, including the steps of various flow processes described above. Likewise, a mobile device, a cell phone, a smartphone, a laptop, a desktop, a notebook, a tablet, a wearable device, a server, etc., which includes some of the same components of the computer system 1800, may run an application (or software) and perform the steps and functionalities described above. Computer system 1800 may connect to a network 1814, e.g., Internet, or other network, to receive inquiries, obtain data, and transmit information and incentives as described above.

The computer system 1800 typically includes a memory 1802, a secondary storage device 1804, and a processor 1806. The computer system 1800 may also include a plurality of processors 1806 and be configured as a plurality of, e.g., bladed servers, or other known server configurations. The computer system 1800 may also include a network connection device 1808, a display device 1810, and an input device 1812.

The memory 1802 may include RAM or similar types of memory, and it may store one or more applications for execution by processor 1806. Secondary storage device 1804 may include a hard disk drive, floppy disk drive, CD-ROM drive, or other types of non-volatile data storage. Processor 1806 executes the application(s), such as those described herein, which are stored in memory 1802 or secondary storage 1804, or received from the Internet or other network 1814. The processing by processor 1806 may be implemented in software, such as software modules, for execution by computers or other machines. These applications preferably include instructions executable to perform the system and subsystem component functions and methods described above and illustrated in the FIGS. herein. The applications preferably provide graphical user interfaces (GUIs) through which users may view and interact with subsystem components.

The computer system 1800 may store one or more database structures in the secondary storage 1804, for example, for storing and maintaining the information necessary to perform the above-described functions. Alternatively, such information may be in storage devices separate from these components.

Also, as noted, processor 1806 may execute one or more software applications to provide the functions described in this specification, specifically to execute and perform the steps and functions in the process flows described above. Such processes may be implemented in software, such as software modules, for execution by computers or other machines. The GUIs may be formatted, for example, as web pages in HyperText Markup Language (HTML), Extensible Markup Language (XML) or in any other suitable form for presentation on a display device depending upon applications used by users to interact with the computer system 1800.

The input device 1812 may include any device for entering information into the computer system 1800, such as a touch-screen, keyboard, mouse, cursor-control device, microphone, digital camera, video recorder or camcorder. The input and output device 1812 may be used to enter information into GUIs during performance of the methods described above. The display device 1810 may include any type of device for presenting visual information such as, for example, a computer monitor or flat-screen display (or mobile device screen). The display device 1810 may display the GUIs and/or output from sub-system components (or software).

Examples of the computer system 1800 include dedicated server computers, such as bladed servers, personal computers, laptop computers, notebook computers, palm top computers, network computers, mobile devices, or any processor-controlled device capable of executing a web browser or other type of application for interacting with the system.

Although only one computer system 1800 is shown in detail, system 1800 may use multiple computer systems or servers as necessary or desired to support the users and may also use back-up or redundant servers to prevent network downtime in the event of a failure of a particular server. In addition, although computer system 1800 is depicted with various components, one skilled in the art will appreciate that the system can contain additional or different components. In addition, although aspects of an implementation consistent with the above are described as being stored in a memory, one skilled in the art will appreciate that these aspects can also be stored on or read from other types of computer program products or computer-readable media, such as secondary storage devices, including hard disks, floppy disks, or CD-ROM; or other forms of RAM or ROM. The computer-readable media may include instructions for controlling the computer system 1800, to perform a particular method, such as methods described above.

The present disclosure is not to be limited in terms of the particular embodiments described in this application, which are intended as illustrations of various aspects. Many modifications and variations can be made without departing from its spirit and scope, as may be apparent. Functionally equivalent methods and apparatuses within the scope of the disclosure, in addition to those enumerated herein, may be apparent from the foregoing representative descriptions. Such modifications and variations are intended to fall within the scope of the appended representative claims. The present disclosure is to be limited only by the terms of the appended representative claims, along with the full scope of equivalents to which such representative claims are entitled. It is also to be understood that the terminology used herein is for the purpose of describing particular embodiments only, and is not intended to be limiting.

What is claimed is:

1. A phasor measurement method for an M-class phasor measurement unit with a low computation burden, the method comprising:
    designing, at a controller of the M-class phasor measurement unit, a phasor measurement filter with a short data window to estimate initial phasors, wherein:
        a Hann window is selected as the weighted coefficients;
        K=2 is selected as Taylor's series order to ensure a dynamic accuracy and an anti-interference ability; and
        an observation window length $T_L$ is set as three cycles (0.06 s) to maintain a dynamic performance and an anti-interference capability;
    receiving, at an acquisition module of the M-class phasor measurement unit, power signals including voltage signals and current signals;
    calculating, at the controller, an initial phasor by:

$$\dot{X}_c = a_0 + jb_0 = \sum_{i=0}^{2N} (q_i^{a_0} + jq_i^{b_0})x(i) \quad (43)$$

where $\dot{X}_c$ denotes an estimated fundamental phasor, $a_0$ and $b_0$ are Taylor's series coefficients, $q_i^{a_0}$ and $q_i^{b_0}$ are the coefficients of phasor measurement filter (PMF), and $x(i)$ is the sample value of power signals;
    calculating a synchrophasor by:

$$\dot{X}_{t_k} = \dot{X}_c e^{-j2\pi f_n t_k} \quad (44)$$

where $\dot{X}_{t_k}$ denotes the synchrophasor to be reported, $f_n$ is the nominal frequency, and $t_k$ is the reporting time;
    filtering, at the controller of the M-class phasor measurement unit, a FIR lowpass filter to filter low-frequency interferences in the estimated initial phasors, wherein: the estimated initial phasors include a negative fundamental component, harmonics, and inter-harmonics; the FIR lowpass filter equation is given as:

$$\dot{X}'_{t_k} = \sum_{i=k}^{k+N_f} h_{1p}(i-k)\dot{X}_{t_k}(i - N_f/2) \quad (45)$$

where $N_f$ is a lowpass filter order, $h_{1p}(i)$ are lowpass filter coefficients, and $\dot{X}_{t_k}'$ is filtered phasor;
        passband and stopband bandwidths are determined by a reporting rate of PMU;
        a maximum passband bandwidth is 0~min(5, $F_r/5$) Hz and a stopband bandwidth is $F_r/2$~$F_c/2$, where $F_c$ is a computation rate;
    estimating an initial frequency based on LS method by:

$$\hat{f}(k) = \frac{1}{2\pi}\sum_{i=0}^{M} q_{1i}\varphi(k - M/2 + i) + f_n \quad (46)$$

where $\varphi(k)$ is the phase angle of synchrophasor, $\hat{f}(k)$ is the estimated frequency, and $q_1$ is used to filter (M+1) estimated phase angles to obtain the initial frequency;
    calculating a second derivative of the initial frequency by:

$$cf_2(k) = \sum_{i=0}^{M} q_{2i}\hat{f}(k - M/2 + i) \quad (47)$$

where $cf_2(k)$ is the second derivative of the frequency, and $q_2$ is used to filter (M+1) initial frequencies;
    correcting a frequency error by:

$$\hat{f}_0(k) = \hat{f}(k) - 2.85 \times 10^{-5} cf_2(k) \quad (48)$$

to obtain a final frequency $\hat{f}_0$;
    correcting a final amplitude using:

$$\hat{\dot{X}}_c = \frac{\dot{X}'_{t_k}}{|H(\hat{f}_0)| \cdot |H_{1p}(\hat{f}_0 - 50)|} \quad (49)$$

where $\hat{f}_0$ is an estimated fundamental frequency, $|H(f)|$ and $|H_{1p}(f)|$ are magnitude response of the designed phasor measurement filter and the lowpass filter, and $\hat{\dot{H}}_c$ is a final synchrophasor;
    estimating an ROCOF estimation method based on the filtering characteristics of LS method by $$r\hat{f}(k) = \sum_{i=0}^{M} q_{1i} f(k - M/2 + i) \quad (50)$$

that uses $q_1$ to filter (M+1) estimated frequencies;
    calculating a second derivative of ROCOF by:

$$c_2(k) = \sum_{i=0}^{M} q_{2i} r\hat{f}(k - M/2 + i) \quad (51)$$

that uses $q_2$ to filter (M+1) initial ROCOFs;

correcting an ROCOF error by:

$$\hat{rf}_c(k) = \hat{rf}(k) - 2.85 \times 10^{-5} c_2(k) \quad (52)$$

to obtain a final ROCOF $\hat{rf}_c$; and reporting the final ROCOF $\hat{rf}_c$ and the final synchrophasor to a data center.

\* \* \* \* \*